(12) United States Patent
Yoo et al.

(10) Patent No.: US 10,069,046 B2
(45) Date of Patent: Sep. 4, 2018

(54) BLUISH GREEN PHOSPHOR AND LIGHT EMITTING DEVICE PACKAGE INCLUDING THE SAME

(71) Applicant: LG INNOTEK CO., LTD., Seoul (KR)

(72) Inventors: Jae Soo Yoo, Seoul (KR); Jin Sung Kim, Seoul (KR); Jong Woo Yoo, Seoul (KR); Ju A Yoo, Seoul (KR); Seong Wook Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/417,494

(22) PCT Filed: Nov. 13, 2014

(86) PCT No.: PCT/KR2014/010909
§ 371 (c)(1),
(2) Date: Jan. 26, 2015

(87) PCT Pub. No.: WO2015/072765
PCT Pub. Date: May 21, 2015

(65) Prior Publication Data
US 2016/0276548 A1    Sep. 22, 2016

(30) Foreign Application Priority Data

Nov. 13, 2013 (KR) .................. 10-2013-0137879
May 16, 2014 (KR) .................. 10-2014-0058832

(51) Int. Cl.
*H01L 29/20* (2006.01)
*H01L 33/00* (2010.01)
(Continued)

(52) U.S. Cl.
CPC ........ *H01L 33/504* (2013.01); *C09K 11/7734* (2013.01); *C09K 11/7739* (2013.01); *C09K 11/7792* (2013.01); *H01L 33/502* (2013.01)

(58) Field of Classification Search
CPC ..................................................... H01L 33/50
(Continued)

(56) References Cited

U.S. PATENT DOCUMENTS 6,069,440 A    5/2000    Shimizu et al.
7,311,858 B2   12/2007   Wang et al.
(Continued)

FOREIGN PATENT DOCUMENTS

CN    101163775 A    4/2008
CN    101696353 A    4/2010
(Continued)

OTHER PUBLICATIONS

Single Crystal Ce doped scintilator materail with garnet structure sensitive to gamma ray and neutron radiation, D. Slodovnikov, M.H. Weber, D.T. Haven, K.G. Lynn, Mar. 14, 2012, Journal of Crystal Growth, pp. 1-4.*

*Primary Examiner* — Sheikh Maruf
(74) *Attorney, Agent, or Firm* — Birch, Stewart, Kolasch & Birch, LLP

(57) ABSTRACT

Embodiments of the present invention provide a bluish green phosphor represented by Formula 1 below. In particular, the bluish green phosphor and a light emitting device package including the same may have superior luminescence characteristics and improved temperature stability by selecting composition ratios of each ingredients included in a composition formula and ions and thereby minimizing lattice defects in a crystal structure:

$$A_aB_bO_cN_dG_e:RE_h \quad \text{[Formula 1]}$$

wherein A is at least one selected from the group consisting of Be, Mg, Ca, Sr, Ba and Ra elements, B is at least one selected from the group consisting of Si, Ge and Sn elements, O means oxygen, N means nitrogen, G is any one of C, Cl, F and Br elements, C means (Continued)

Carbon, RE is at least one selected from the group consisting of Eu, Ce, Sm, Er, Yb, Dy, Gd, Tm, Lu, $0<a\leq15$, $0<b\leq15$, $0<c\leq15$, $0<d\leq20$, $0<e\leq10$, and $0<h\leq10$.

15 Claims, 14 Drawing Sheets

(51) Int. Cl.
  *H01L 33/50* (2010.01)
  *C09K 11/77* (2006.01)
(58) Field of Classification Search
  USPC .......................... 257/89, 98; 438/22, 25–29
  See application file for complete search history.

(56) References Cited

U.S. PATENT DOCUMENTS

| | | | |
|---|---|---|---|
| 7,794,624 B2 | 9/2010 | Tamaki et al. | |
| 7,906,040 B2* | 3/2011 | Mitomo | C04B 35/597 252/301.4 F |
| 2002/0175619 A1* | 11/2002 | Kita | H01L 51/5265 313/504 |
| 2003/0006469 A1* | 1/2003 | Ellens | C09K 11/7734 257/432 |
| 2003/0146690 A1* | 8/2003 | Ellens | C09K 11/7734 313/503 |
| 2003/0232005 A1* | 12/2003 | Okada | B82Y 30/00 423/659 |
| 2004/0058195 A1* | 3/2004 | Kita | C09K 11/06 428/690 |
| 2005/0274930 A1* | 12/2005 | Roth | C09K 11/7734 252/301.4 R |
| 2005/0274972 A1* | 12/2005 | Roth | C09K 11/7734 257/100 |
| 2006/0027785 A1* | 2/2006 | Wang | C09K 11/592 252/301.4 F |
| 2006/0028122 A1* | 2/2006 | Wang | C09K 11/0883 313/503 |
| 2006/0076883 A1* | 4/2006 | Himaki | C09K 11/0883 313/503 |
| 2006/0255710 A1* | 11/2006 | Mueller-Mach | C04B 35/581 313/485 |
| 2006/0279196 A1* | 12/2006 | Hsu | C09K 11/7734 313/486 |
| 2007/0020485 A1* | 1/2007 | Kita | C09K 11/06 428/690 |
| 2007/0200095 A1* | 8/2007 | Murazaki | C09K 11/7721 252/301.4 H |
| 2008/0031797 A1* | 2/2008 | Xia | C09K 11/7734 423/263 |
| 2008/0231171 A1 | 9/2008 | Schmidt et al. | |
| 2009/0033201 A1* | 2/2009 | Shimooka | C09K 11/0883 313/483 |
| 2009/0134413 A1* | 5/2009 | Roth | C09K 11/663 257/98 |
| 2009/0152496 A1* | 6/2009 | Roth | C09K 11/7734 252/301.6 F |
| 2009/0152575 A1 | 6/2009 | Naum et al. | |
| 2009/0050846 A1 | 12/2009 | Becker et al. | |
| 2009/0309116 A1* | 12/2009 | Kato | C09K 11/7721 257/98 |
| 2010/0001637 A1* | 1/2010 | Satou | H01L 27/322 313/504 |
| 2010/0002454 A1* | 1/2010 | Lee | C09K 11/665 313/503 |
| 2010/0052513 A1* | 3/2010 | Xia | C09K 11/7734 313/503 |
| 2010/0061077 A1* | 3/2010 | Winkler | C09K 11/7774 362/84 |
| 2010/0142181 A1* | 6/2010 | Schmidt | C04B 35/593 362/84 |
| 2010/0187976 A1* | 7/2010 | Winkler | B82Y 30/00 313/504 |
| 2010/0288972 A1 | 11/2010 | Roesler et al. | |
| 2010/0301738 A1 | 12/2010 | Hosokawa et al. | |
| 2010/0322275 A1* | 12/2010 | Ishii | C09K 11/7734 372/43.01 |
| 2011/0006325 A1* | 1/2011 | Ishii | H01L 33/502 257/98 |
| 2011/0006334 A1* | 1/2011 | Ishii | C09K 11/584 257/98 |
| 2011/0062469 A1* | 3/2011 | Camras | H01L 33/58 257/98 |
| 2011/0163322 A1 | 7/2011 | Yoo et al. | |
| 2011/0220949 A1* | 9/2011 | Kim | H01L 33/486 257/98 |
| 2011/0279017 A1 | 11/2011 | Li et al. | |
| 2011/0291142 A1 | 12/2011 | Kim et al. | |
| 2012/0062105 A1* | 3/2012 | Li | C09K 11/0883 313/503 |
| 2012/0062821 A1* | 3/2012 | Takeuchi | C09K 11/7734 349/69 |
| 2013/0001628 A1* | 1/2013 | Yamakawa | C09K 11/0883 257/98 |
| 2013/0240915 A1* | 9/2013 | Nakagawa | H01S 5/02296 257/88 |
| 2014/0008690 A1* | 1/2014 | Funayama | C09K 11/642 257/98 |
| 2014/0246990 A1* | 9/2014 | Kim | H05B 33/0866 315/250 |
| 2014/0307417 A1* | 10/2014 | Yamakawa | F21V 3/04 362/84 |
| 2014/0320788 A1* | 10/2014 | Weiler | H01L 33/502 349/71 |
| 2015/0048399 A1* | 2/2015 | Weiler | H01L 33/502 257/98 |
| 2015/0109758 A1* | 4/2015 | Allen | F21V 3/0463 362/84 |
| 2015/0377429 A1* | 12/2015 | Yoo | F21K 9/56 313/503 |

FOREIGN PATENT DOCUMENTS

| | | |
|---|---|---|
| CN | 101842461 A | 9/2010 |
| CN | 101878280 A | 11/2010 |
| CN | 102142503 A | 8/2011 |
| CN | 102191045 A | 9/2011 |
| CN | 102325856 A | 1/2012 |
| CN | 102939355 A | 2/2013 |
| JP | 2009-79069 A | 4/2009 |
| KR | 10-2011-0016377 A | 2/2011 |
| KR | 10-2013-0028374 A | 3/2013 |
| KR | 10-1510124 B1 | 4/2015 |
| WO | WO 2007/096333 A1 | 8/2007 |
| WO | WO 2011/034226 A1 | 3/2011 |
| WO | WO 2012/050304 A2 | 4/2012 |
| WO | WO 2013/058478 A1 | 4/2013 |

* cited by examiner

[FIG. 1]
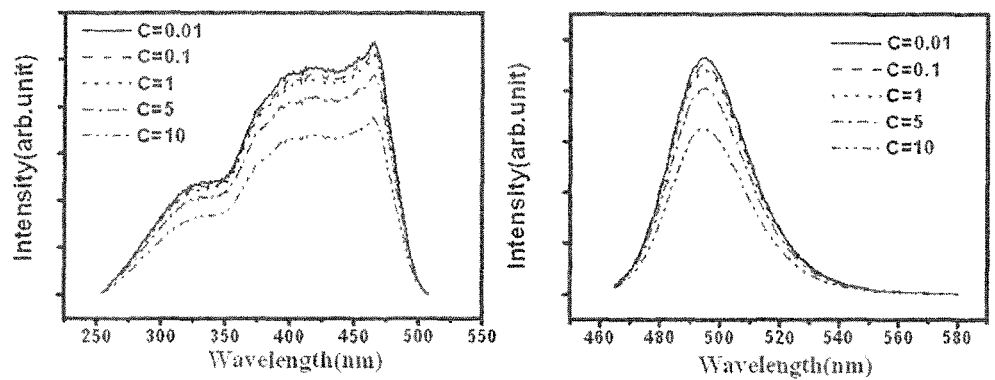
[FIG. 2]
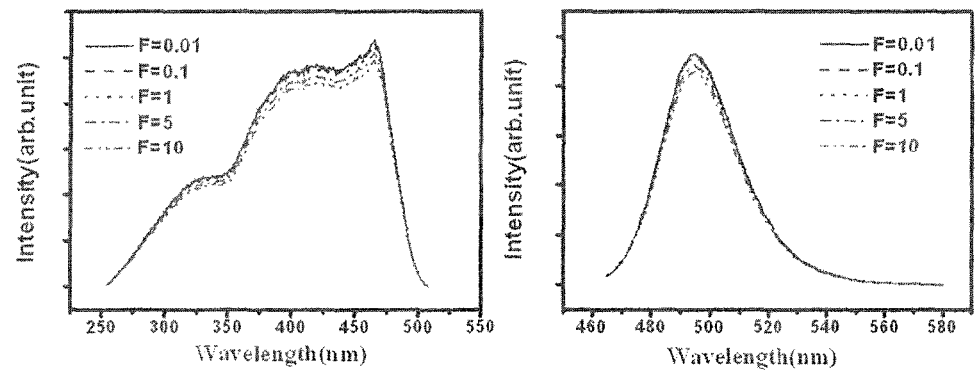
[FIG. 3]
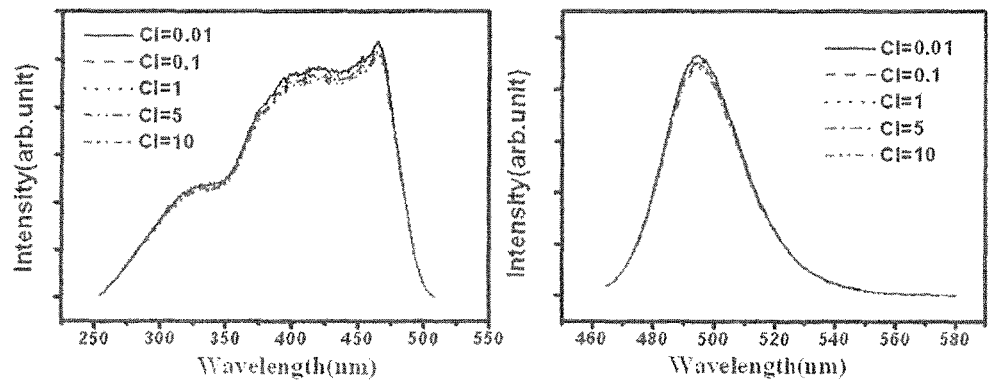

[FIG. 4]
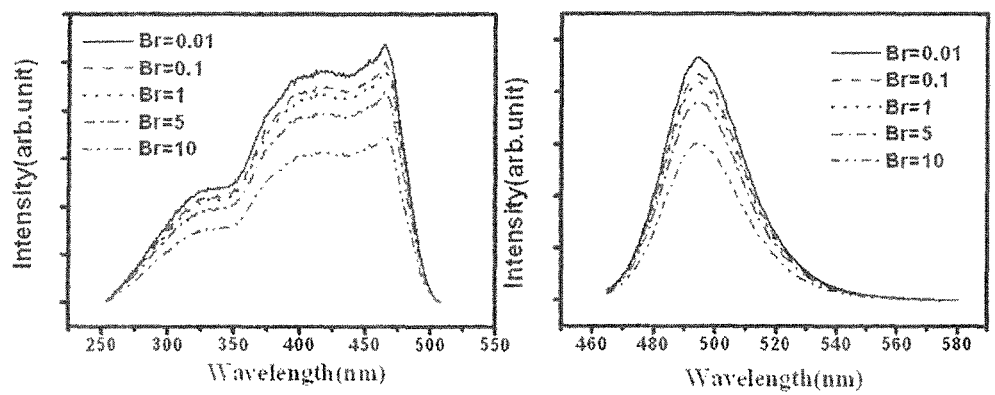
[FIG. 5]
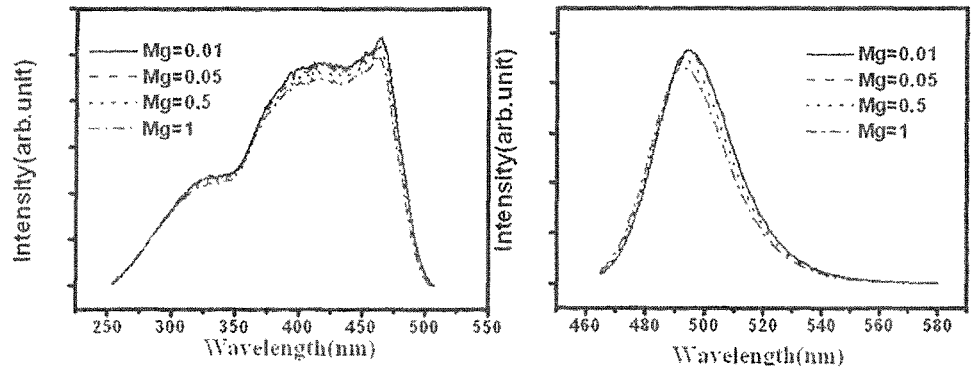

[FIG. 6]
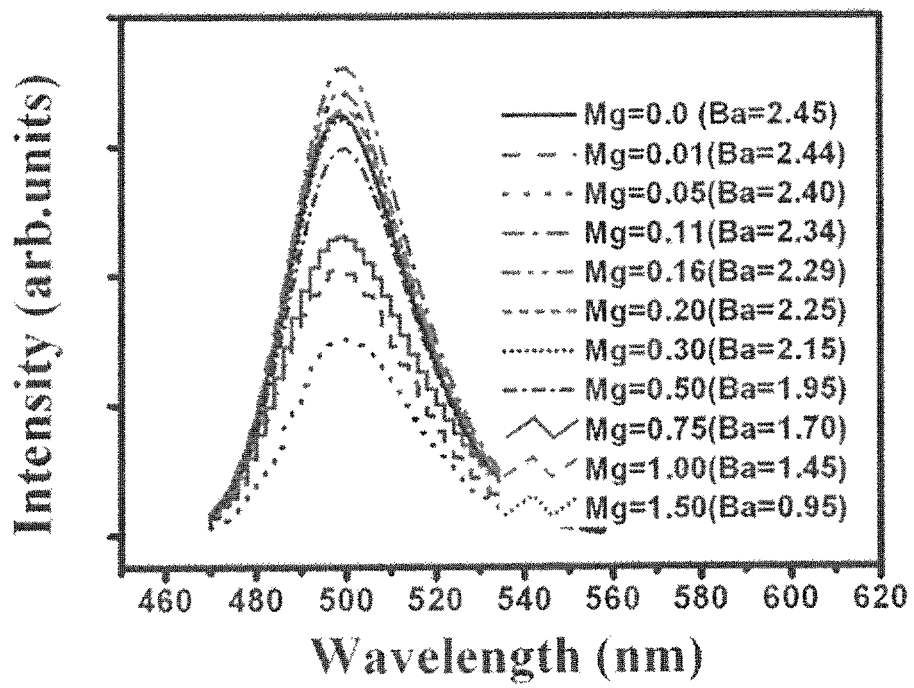
[FIG. 7]
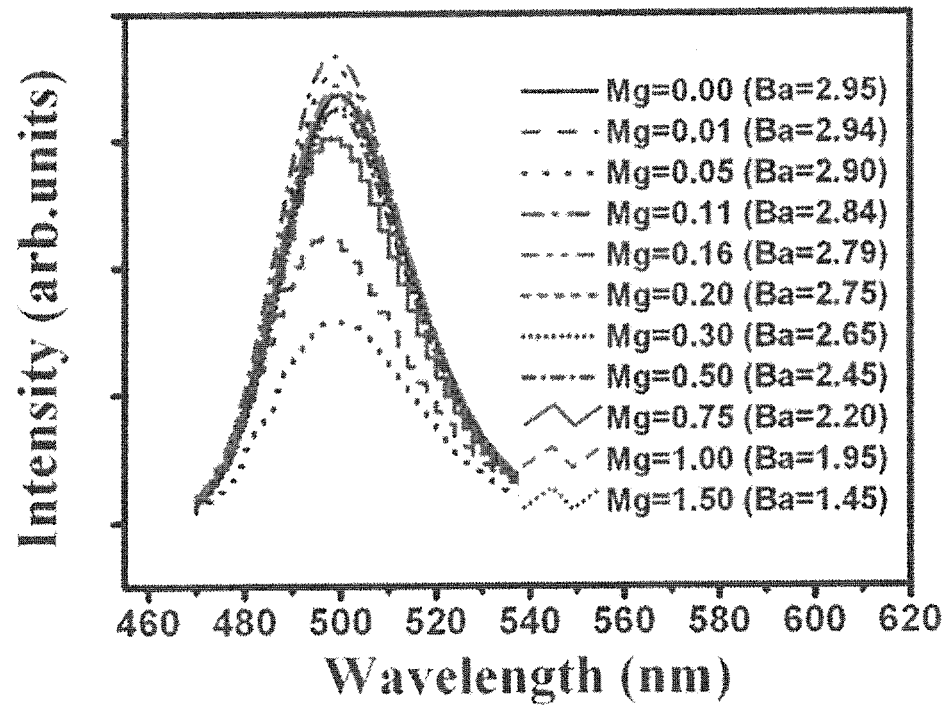

[FIG. 8]
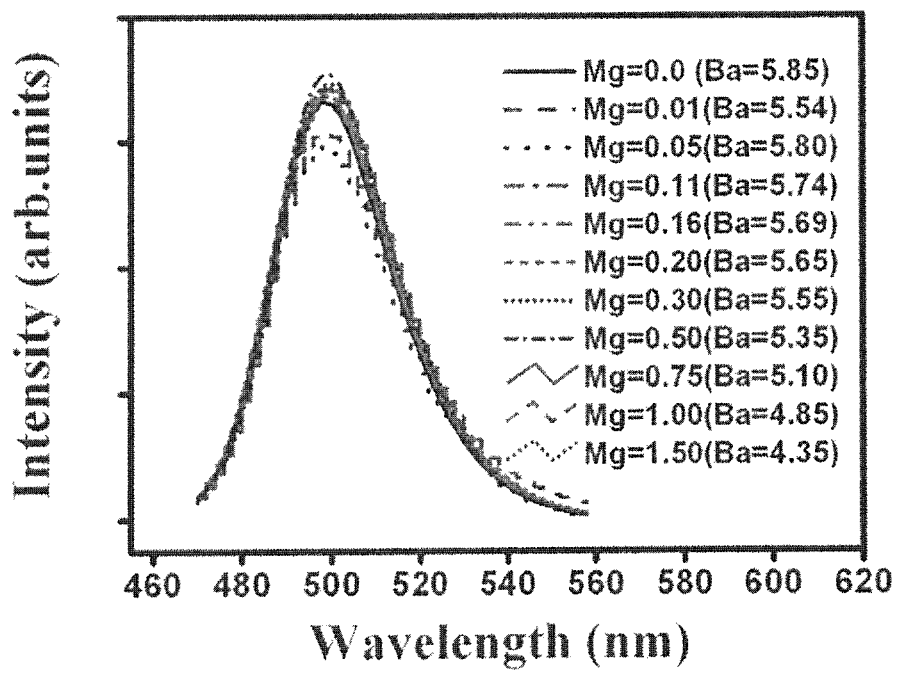
[FIG. 9]
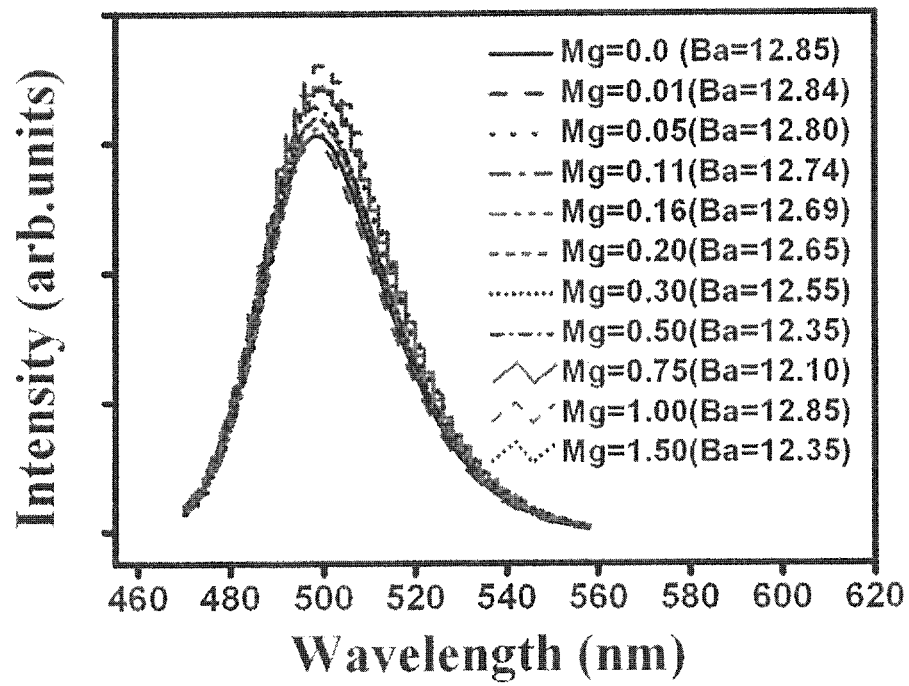

[FIG. 10]
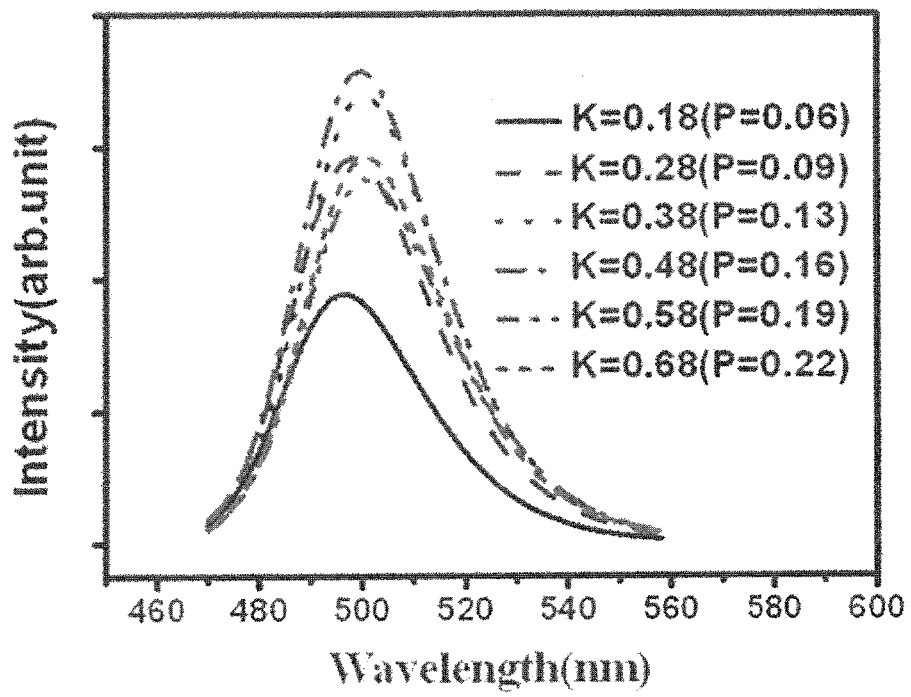
[FIG. 11]
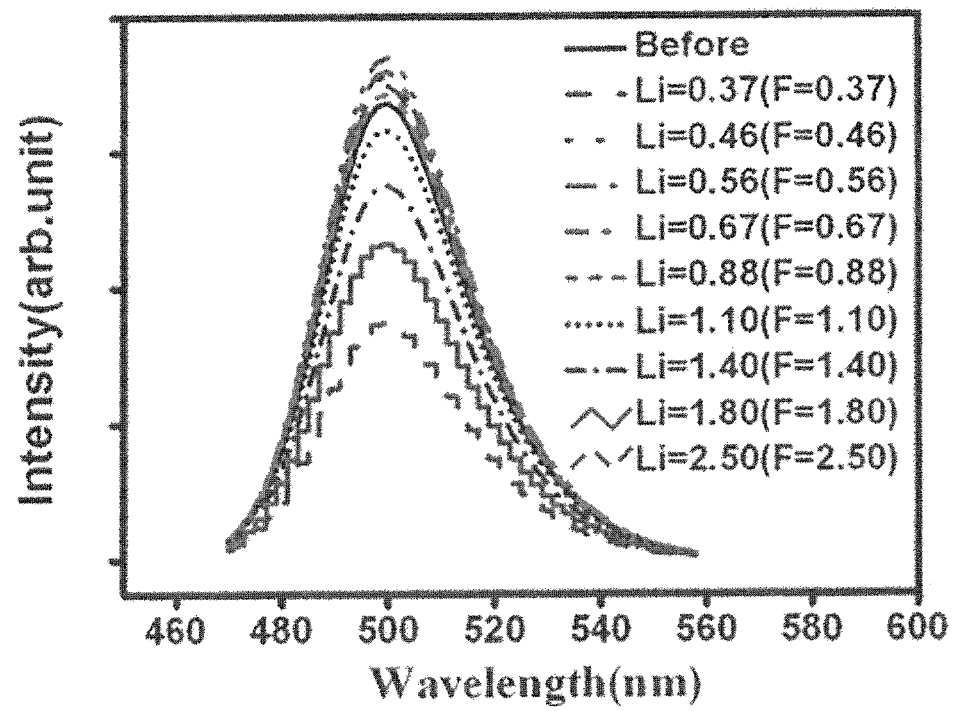

[FIG. 12]
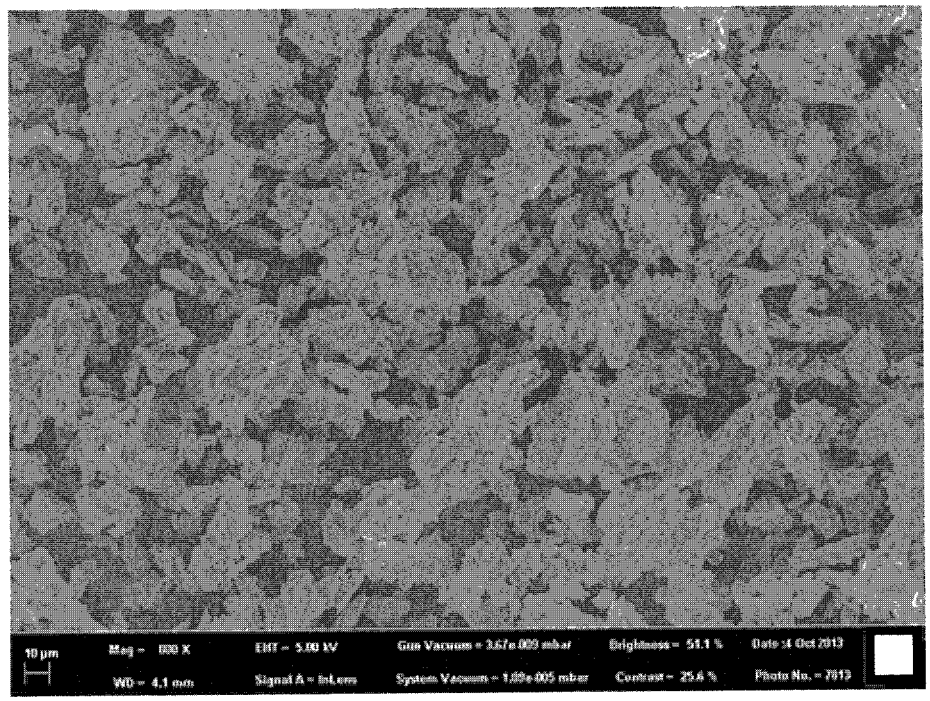
[FIG. 13]
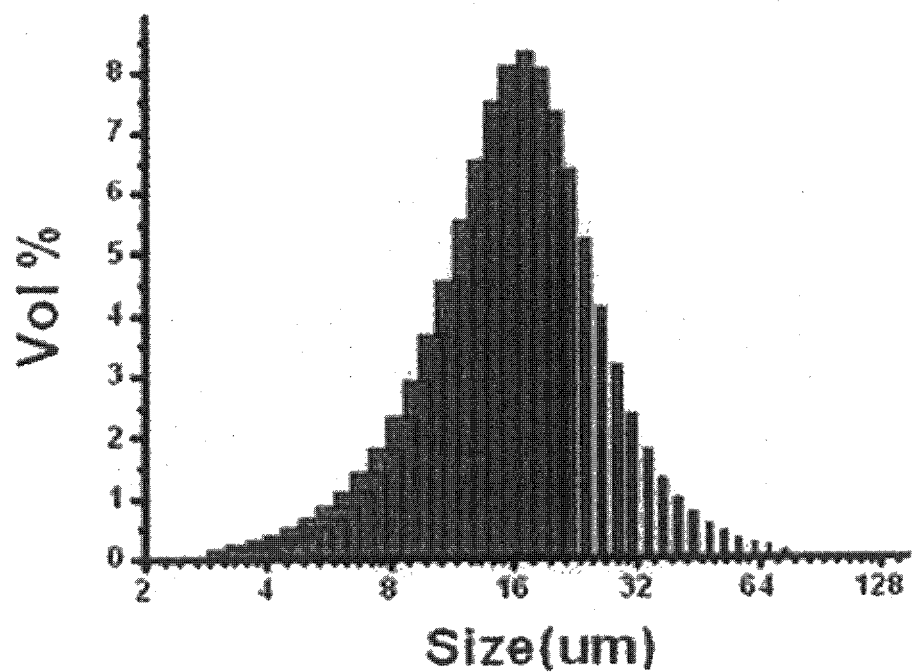

[FIG. 14]
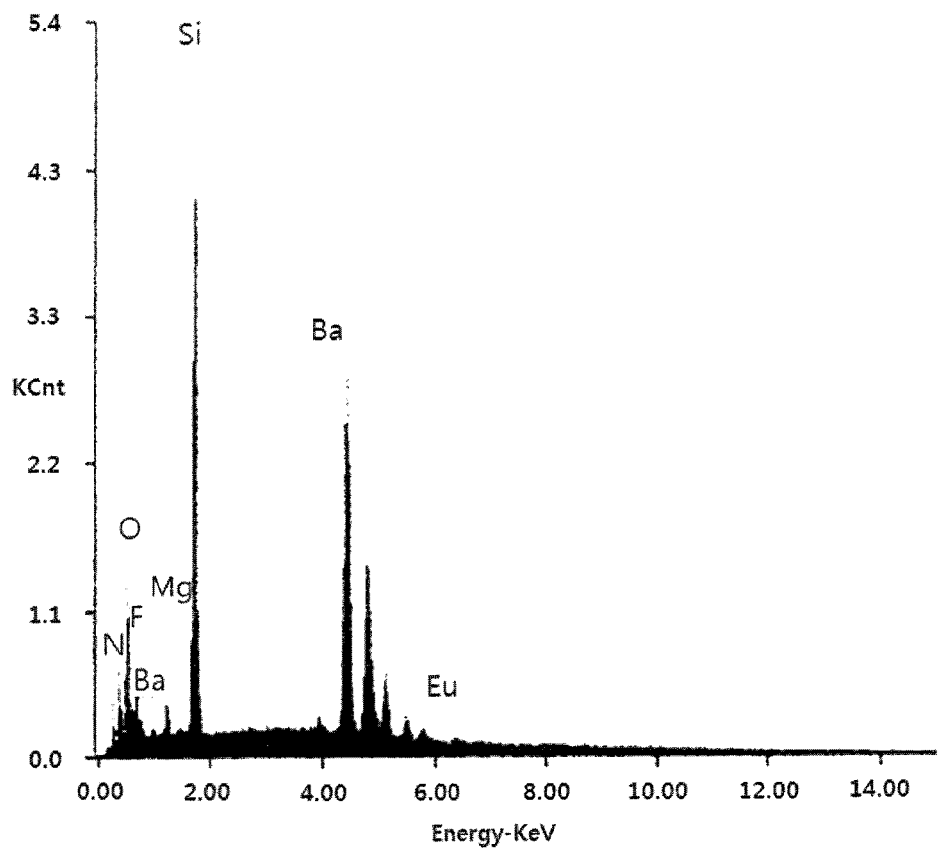
[FIG. 15]
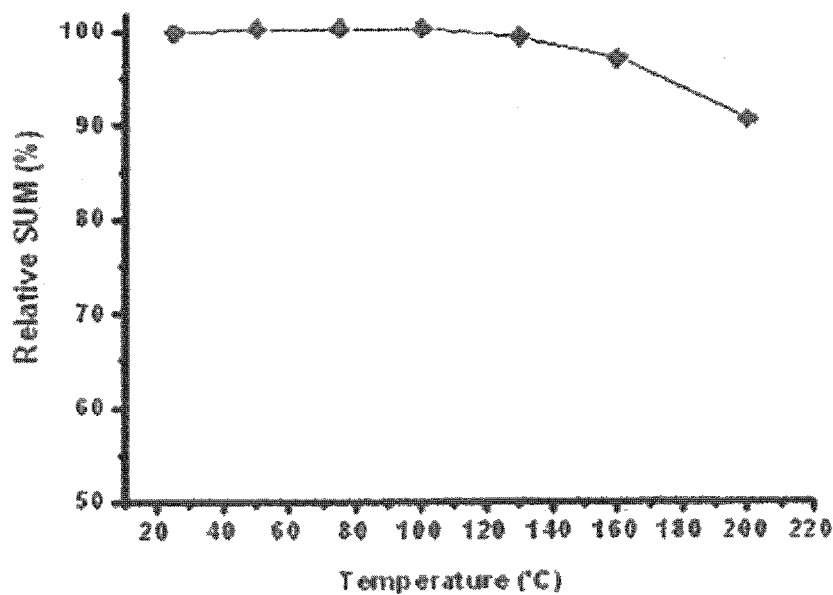

[FIG. 16]
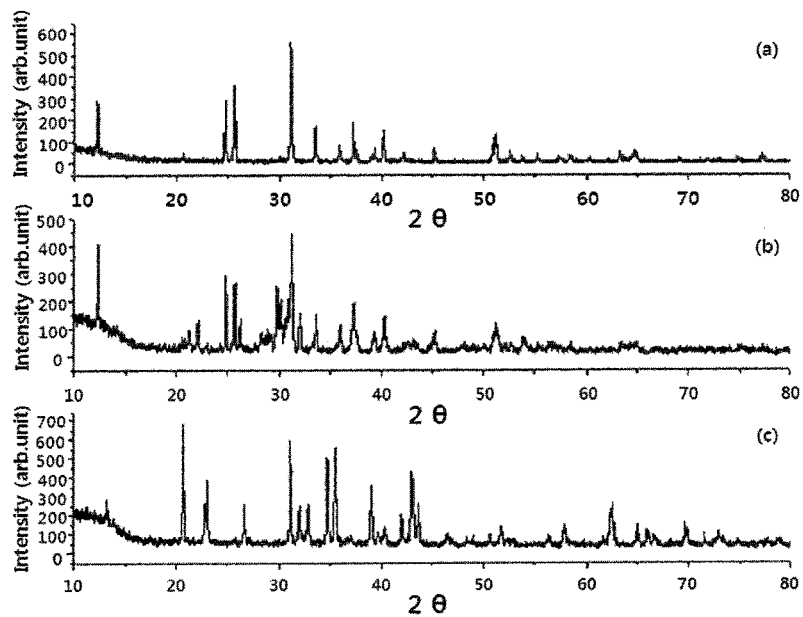
[FIG. 17]
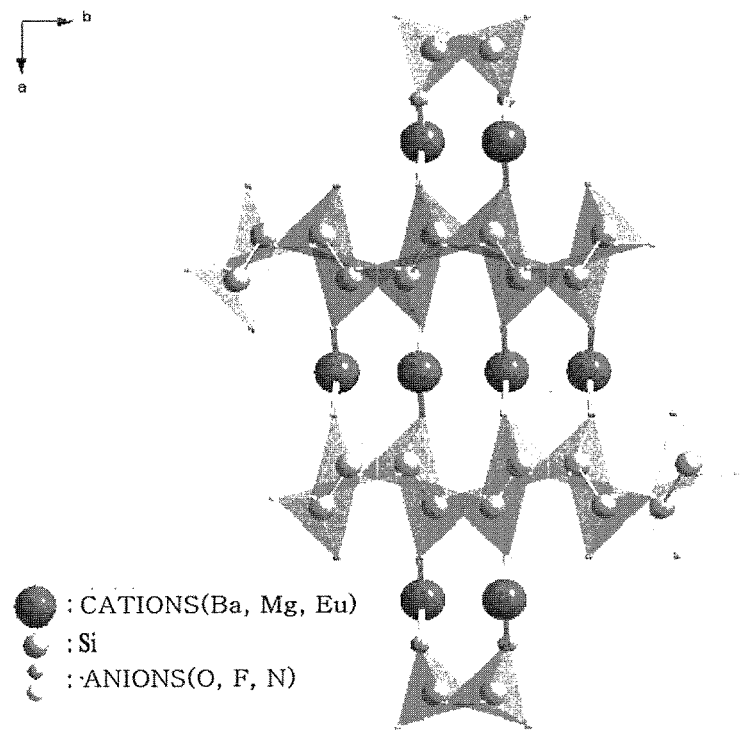
: CATIONS(Ba, Mg, Eu)
: Si
: ANIONS(O, F, N)

[FIG. 18]
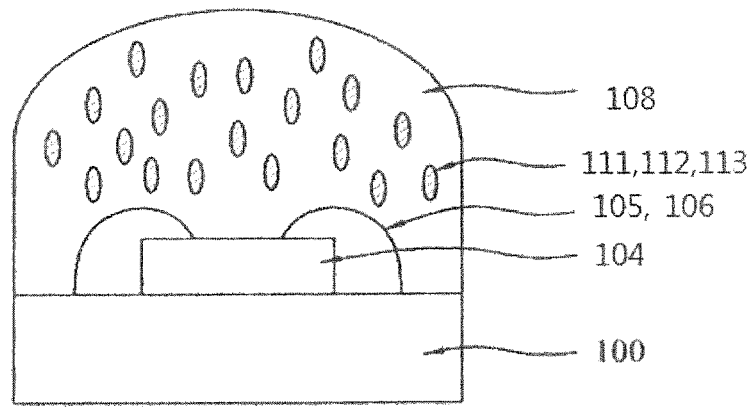
[FIG. 19]
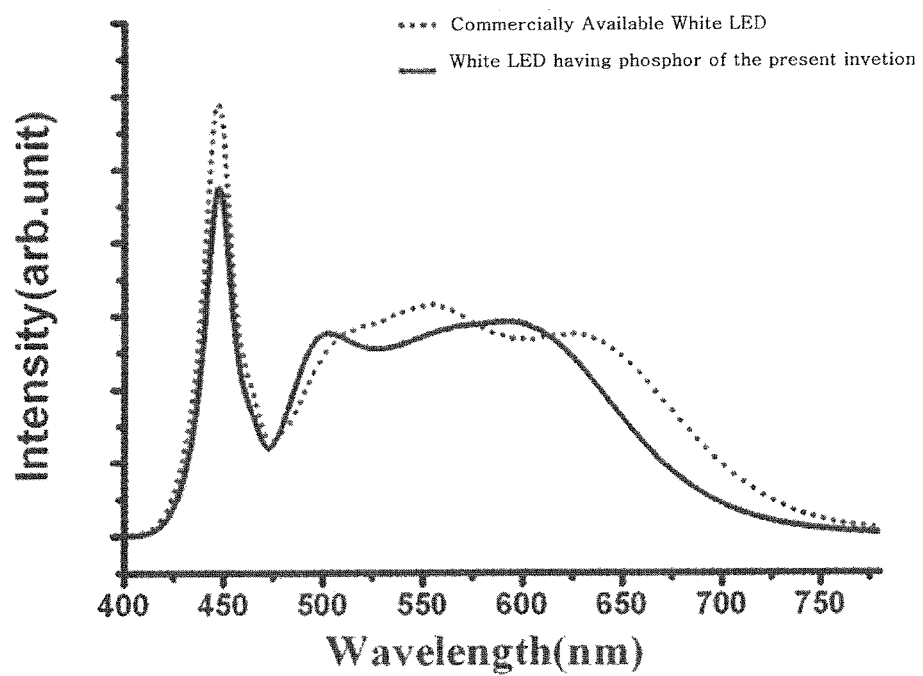

[FIG. 20]
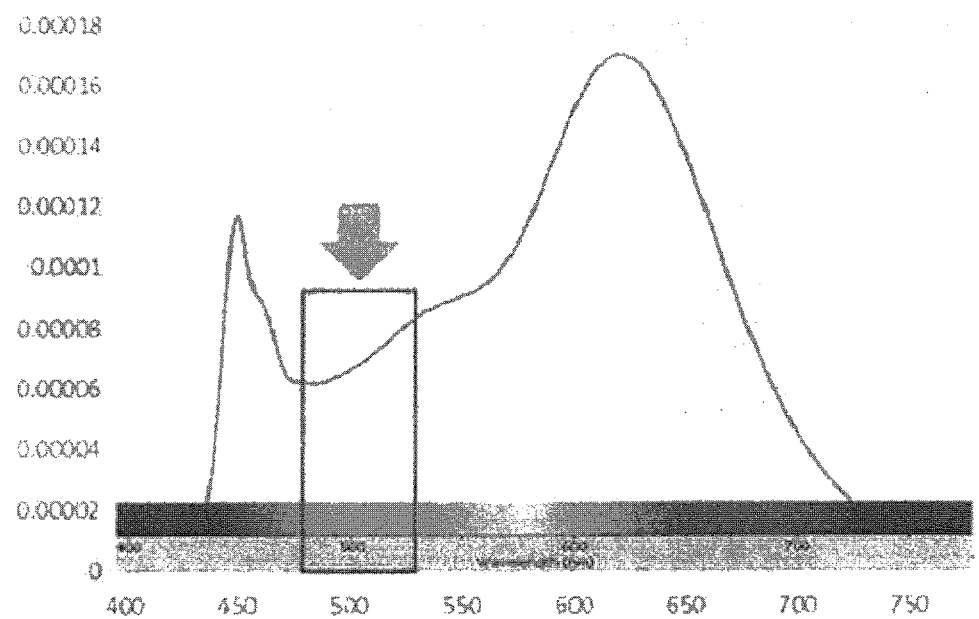
[FIG. 21]
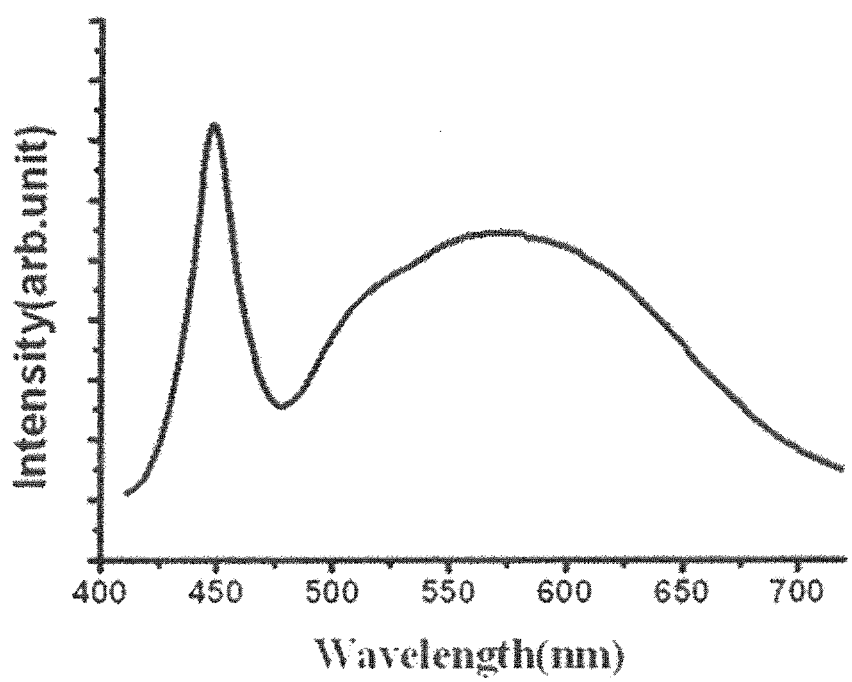

[FIG. 22]
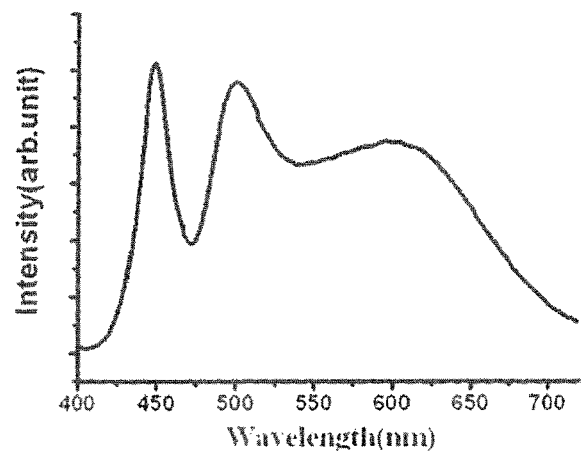
[FIG. 23]
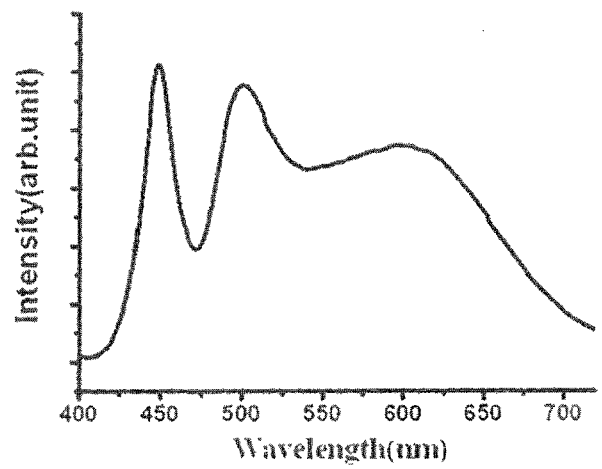
[FIG. 24]
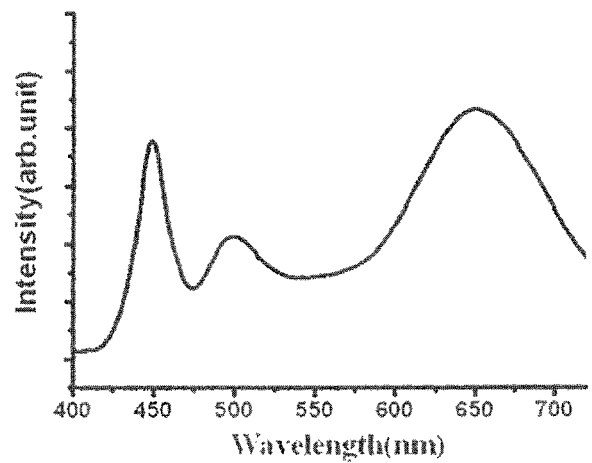

[FIG. 25]
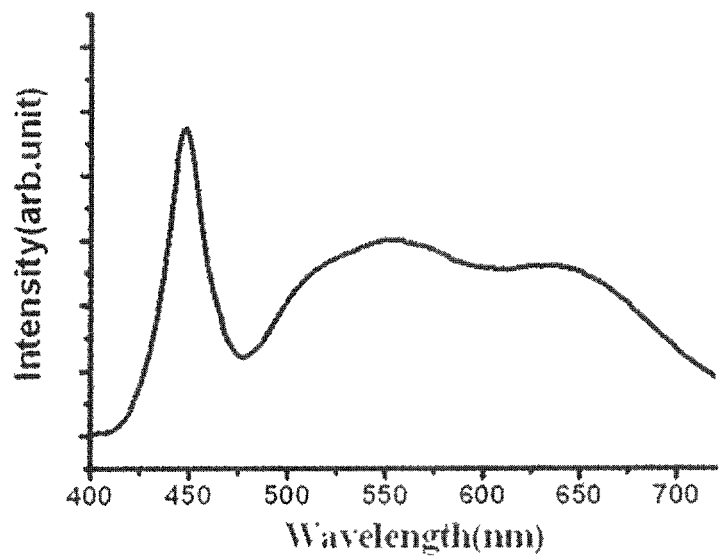
[FIG. 26]
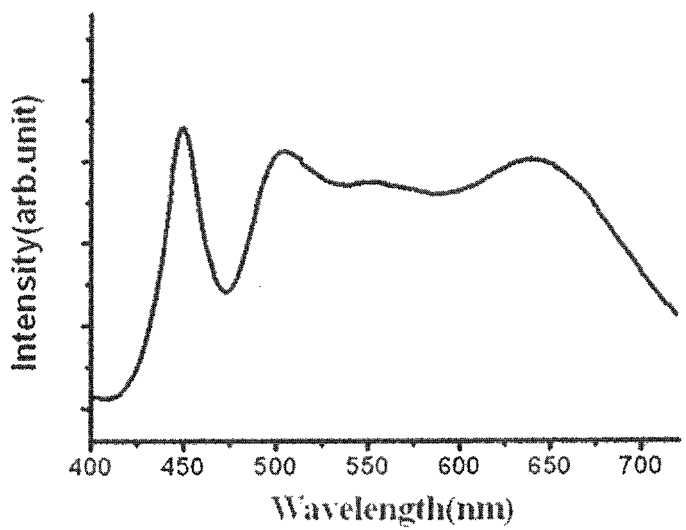

[FIG. 27]
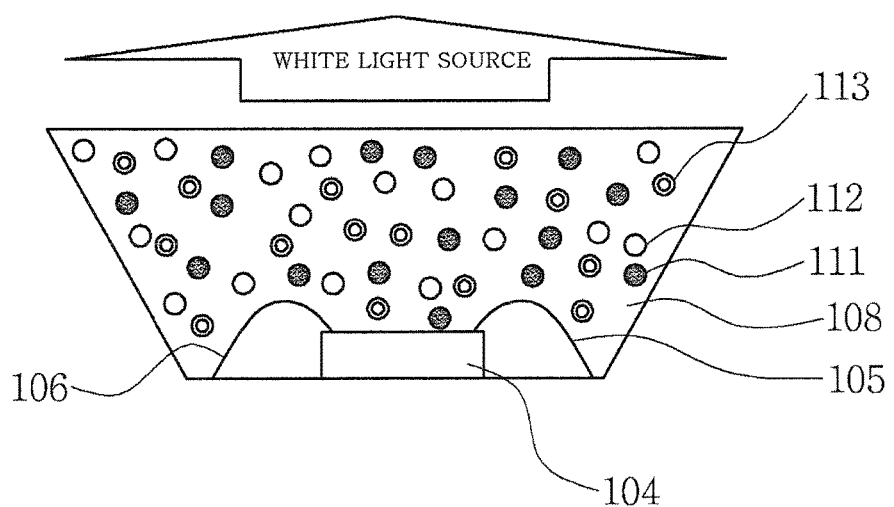
[FIG. 28]
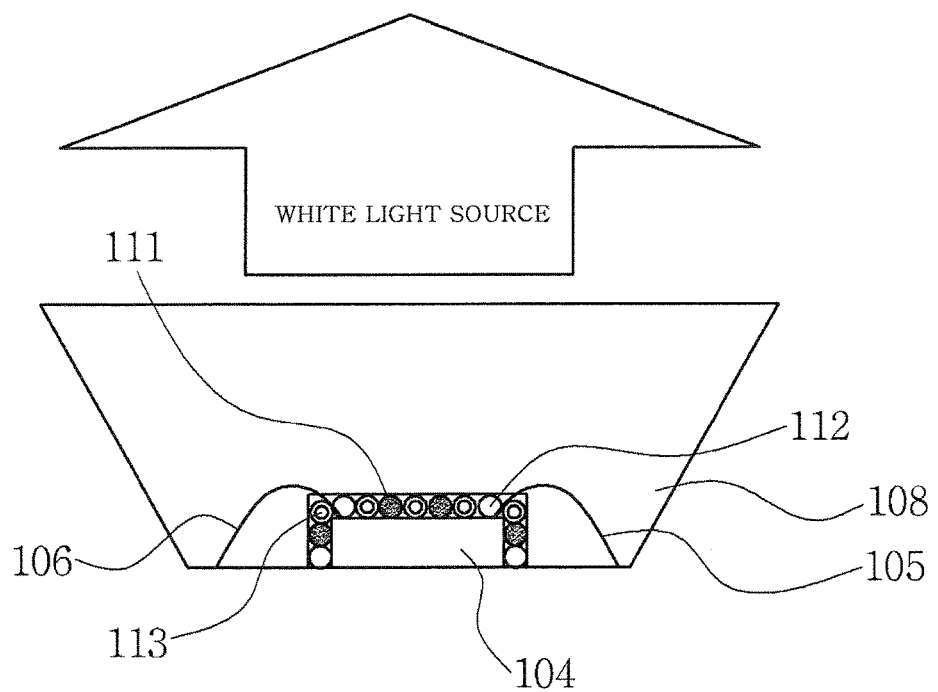

[FIG. 29]
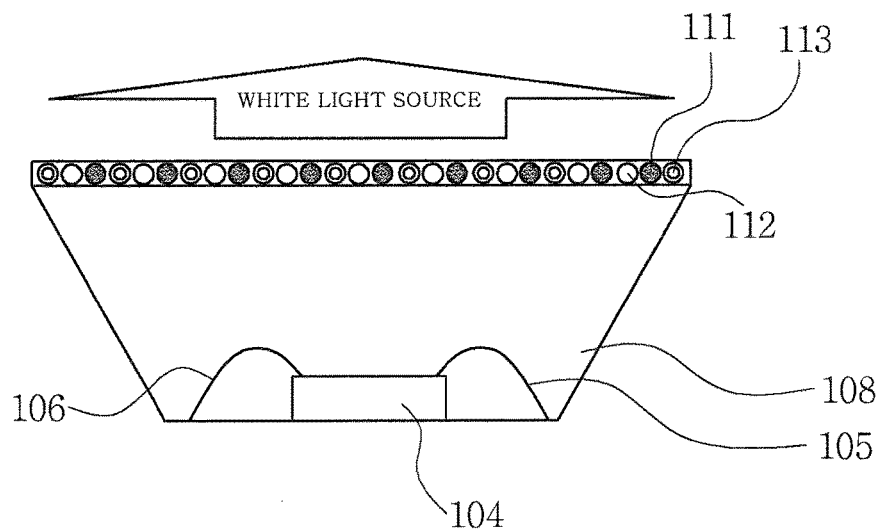
[FIG. 30]
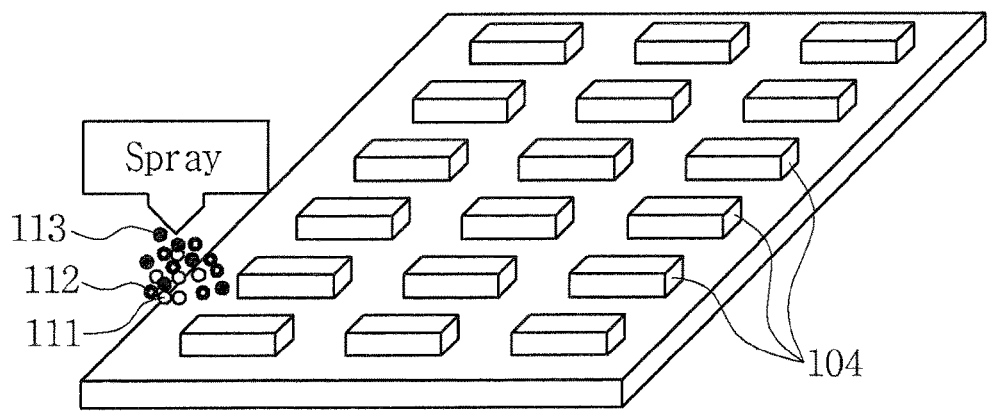

BLUISH GREEN PHOSPHOR AND LIGHT EMITTING DEVICE PACKAGE INCLUDING THE SAME

TECHNICAL FIELD

Embodiments of the present invention relate to a phosphor emitting light of a bluish green wavelength area, and a light emitting device package and lighting apparatus including the same.

BACKGROUND ART

Phosphors function as a vehicle converting energy of an excitation source into energy of visible light and are essential elements to realize a variety of display device images. At the same time, efficiency and color reproduction range of phosphors are important elements directly related to efficiencies and color reproduction ranges of display products and lighting products.

Blue LED devices are one of diode devices emitting white light. In Blue LED devices, a phosphor emitting blue light as an excitation source to yellow light is coated over a device emitting blue light, to realize white light by mixing blue light emitted from the device and yellow light emitted from the phosphor. That is, LED devices emitting white light use blue light emitted from a device and a second light source, by coating a phosphor over an LED, and, in general, a YAG:Ce phosphor emitting yellow light is coated over a blue LED to generate white light [U.S. Pat. No. 6,069,440].

However, the method has drawbacks such as quantum deficits occurred by using second light, efficiency reduction due to reradiation efficiency, and uneasy color rendering. Therefore, conventional white LED backlights manufactured by combining a blue LED chip and a yellow phosphor express unnatural color due to deficiency of green and red color ingredients and, as such, applications thereof are limited to screens of mobile phones and laptop PCs. Despite such advantages, the method is broadly used due to advantages such as easy driving and dramatically low price.

Meanwhile, regarding white LED, phosphors emitting visible light by being excited by excitation sources having high energy such as ultraviolet, blue light or the like have been mainly developed. However, conventional phosphors have deteriorated luminance when exposed to an excitation source. Accordingly, recently, as phosphors having reduced luminance deterioration and using silicon nitride-related ceramics as a host crystal, nitrides or phosphors which have a stable crystal structure and may shift excitation light or luminescence to a longer wavelength have attracted attention.

In particular, a CaAlSiN3:Eu red phosphor was developed in 2004 and a β-SiAlON:Eu green phosphor was developed in 2005, as pure nitrides. When such phosphors are combined with a blue LED chip, light having superior color purity is emitted, in particular, small temperature change due to excellent durability is exhibited and, as such, long lifespan and reliability of LED light source may be improved.

A recently developed lighting LED combined after improving a blue LED chip, a $Lu_3Al_5O_{12}$:Ce green phosphor, and a $CaAlSiN_3$:Eu red phosphor such that three primary color ingredients may be generated by converting light having a wavelength of 450 nm into a green or yellow phosphor having a wavelength of 520 to 570 nm, or a red phosphor having a wavelength of 650 nm. However, by such combination, it is not easy to maintain color rendering of 90 or more, and a relatively large amount of a red phosphor is required to select a proper white coordinate and, as such, luminous intensity may be lowered.

Meanwhile, research into acid nitride phosphors has been performed since 2009, but lattice defects frequently occur due to bonding of unstable oxygen ions and nitrogen ions and thereby the acid nitride phosphors are not trusted, and, accordingly, commercialization is being delayed.

Accordingly, Korean Patent Pubs. No. 2011-0016377 and 013-00283742 disclose that a crystal field surrounding Eu ions has a large impact on a central luminescence wavelength of a SiON-based phosphor activated by Eu, and a phosphor has excellent temperature stability and temperature characteristics by optimizing ingredients of cations and anions, and a composition ratio thereof. Here, a primary luminescence wavelength of the phosphor is 540 to 570 nm. However, until now, it has been difficult to determine how a crystal structure change of such an acid nitrides phosphor and light properties are connected [International Publication No. 2007/096333 and Chemistry of materials, 25, pages 1852 to 1857, 2013].

Accordingly, the present inventors tried to resolve the conventional problems and, as a result, confirmed that when ingredients of cations and anions, and a composition ratio thereof are optimized, a highly efficient and stable bluish green luminescence phosphor may be provided by minimizing lattice defects in a homogeneous phase and a multi-phase crystal structure at thermodynamic synthetic temperature, and, when a white LED obtained by coating a mixed green phosphor and red phosphor over a conventional blue LED is prepared, a white LED device is manufactured by mixing a bluish green luminescence phosphor according to the present invention therewith and thereby a color rendering index and luminous intensity of a manufactured white LED device are improved, thus completing the present invention.

DISCLOSURE

Technical Problem

An object of the present invention devised to solve the problem lies in a bluish green phosphor having improved light intensity and thermal stability by optimal combination of a composition ratio, and a light emitting device package including the same, luminance and color rendering index of which are improved.

Technical Solution

The object of the present invention can be achieved by providing a bluish green phosphor represented by Formula 1 below:

  [Formula 1]

wherein A is at least one selected from the group consisting of Be, Mg, Ca, Sr, Ba and Ra elements, B is at least one selected from the group consisting of Si, Ge and Sn elements, O means oxygen, N means nitrogen, G is any one of C, Cl, F and Br elements, C means carbon, RE is at least one selected from the group consisting of Eu, Ce, Sm, Er, Yb, Dy, Gd, Tm, Lu, Pr, Nd, Pm and Ho, $0<a\leq15$, $0<b\leq15$, $0<c\leq15$, $0<d\leq20$, $0<e\leq10$, and $0<h\leq10$.

In Formula 1, A may be Ba.

In another aspect of the present invention, provided herein is a bluish green phosphor represented by Formula 2 below may be provided:

  [Formula 2]

wherein B is at least one selected from the group consisting of Si, Ge and Sn elements, O means oxygen, N means nitrogen, G is any one of C, Cl, F and Br elements, C means carbon, RE is at least one selected from the group consisting of Eu, Ce, Sm, Er, Yb, Dy, Gd, Tm, Lu, Pr, Nd, Pm and Ho, $0.5<x\le 15$, $0<y\le 10$, $0.5<x+y\le 15$, $0<e\le 10$, and $0<h\le 10$.

In Formula 2 above, a ratio of y to x, namely, a value of y/x may be defined as follows:

$0<y/x\le 2$

As one embodiment of Formula 2, $2\le x\le 5$, $0<y\le 2$, and $2<x+y\le 7$.

In Formula 2, B may be Si and RE may be Eu.

In another aspect of the present invention, provided herein is a bluish green phosphor represented by Formula 3 below:

$A_aB_bO_cN_dG_eD_fE_g:RE_h$ [Formula 3]

wherein A is at least one selected from the group consisting of Be, Mg, Ca, Sr, Ba and Ra elements, B is at least one selected from the group consisting of Si, Ge and Sn elements, O means oxygen, N means nitrogen, G is any one of C, Cl, F and Br elements, C means carbon, D is one element or a mixture of two or more elements selected from Li, Na and K, E is at least one selected from the group consisting of P, As, Bi, Sc, Y and Lu, RE is at least one selected from the group consisting of Eu, Ce, Sm, Er, Yb, Dy, Gd, Tm, Lu, Pr, Nd, Pm and Ho, $0<a\le 15$, $0<b\le 15$, $0<c\le 15$, $0<d\le 20$, $0<e\le 10$, $0<f\le 10$, $0<g\le 10$, and $0<h\le 10$.

As one embodiment, in Formula 3, D may be at least one of Li and K, and E may be P.

In the embodiment described above, the bluish green phosphor may use a wavelength area of 300 nm to 500 nm as an excitation source, and may have a luminescence wavelength of 460 nm to 540 nm.

A central wavelength of the luminescence wavelength may be 490 nm to 500 nm.

In the embodiment described above, the bluish green phosphor may have a particle size distribution a D10 particle size distribution of 1 μm or more and less than 10 μm, a particle size distribution of a D50 particle size distribution of 10 μm or more and less than 30 μm, and a particle size distribution of a D90 particle size distribution of 20 μm or more and less than 70 μm.

In another aspect of the present invention, provided herein is a light emitting device package including at least one light emitting device; and a molding part disposed on the at least one light emitting device and including a phosphor composition which includes the bluish green phosphor in the embodiment described above.

The at least one light emitting device may emit light of an ultraviolet wavelength area or a blue light wavelength area.

The phosphor composition may further include any one of a green or yellow phosphor, and a red phosphor.

Any one of the green and yellow phosphor may have a central luminescence wavelength of 510 nm to 570 nm, and the red phosphor may have a central luminescence wavelength of 610 nm to 670 nm.

Any one of the green and yellow phosphor may be $(Lu,Gd)_3(Al,Ga)_5O_{12}:Ce^{3+}$ or $(Y,Gd)_3(Al,Ga)_5O_{12}:Ce^{3+}$.

The red phosphor may be $(Sr,Ca)AlSiN_3:Eu^{2+}$ or $(Sr,Ba,Ca)_2Si_5N_8:Eu^{2+}$.

The phosphor composition may be included in the molding part as a dispersive type, a conformal type, or a remote type.

The molding part may include a resin part, and the bluish green phosphor may be included in an amount of 0.1 or more to 99 or less parts by weight based on 100 parts by weight of the resin.

The light emitting device package of the embodiment may have a color rendering index (CRI) of 60 Ra or more and 99 Ra or less at a color temperature (CCT) of 2,000 K to 10,000 K.

In another aspect of the present invention, provided herein is a light emitting device package, in which any one of the green and yellow phosphor may have a central luminescence wavelength of 525 nm to 535 nm, the red phosphor may has a central luminescence wavelength of 625 nm to 635 nm, and the bluish green phosphor may have a weight ratio as follows:

0 wt %<M<50 wt % wherein M={mb/(mb+mg+mr)}*100, mb is the weight of the bluish green phosphor, mg is the weight of any one of the green and yellow phosphor, and mr is the weight of the red phosphor.

Any one of the green and yellow phosphor may have a central luminescence wavelength of 520 nm to 530 nm, the red phosphor may have a central luminescence wavelength of 650 nm to 665 nm, and the bluish green phosphor may have a weight ratio as follows:

0 wt %<M<20 wt % wherein M={mb/(mb+mg+mr)}*100, mb is the weight of the bluish green phosphor, mg is the weight of any one of the green and yellow phosphor, and mr is the weight of the red phosphor.

Any one of the green and yellow phosphor may have a central luminescence wavelength of 535 nm to 545 nm, the red phosphor may have a central luminescence wavelength of 650 nm to 665 nm, and the bluish green phosphor may have a weight ratio as follows:

0 wt %<M<40 wt % wherein M={mb/(mb+mg+mr)}*100, mb is the weight of the bluish green phosphor, mg is the weight of any one of the green and yellow phosphor, and mr is the weight of the red phosphor.

When the bluish green phosphor has a weight ratio of 5 wt % to 35 wt %, a color rendering index (CRI) of the bluish green phosphor may be 90 Ra to 99 Ra.

In another aspect of the present invention, provided herein is a light emitting device package having luminescence wavelength peaks such as a first peak at 440 nm to 460 nm, a second peak at 490 nm to 510 nm, a third peak at 530 nm to 540 nm, and a fourth peak at 650 nm to 655 nm.

In another aspect of the present invention, provided herein is a lighting apparatus including the light emitting device package of the embodiment described above as a light source.

Advantageous Effects

A bluish green phosphor according to embodiments of the present invention may have improved light intensity and temperature stability by an optimal composition ratio, and a light emitting device package including the same also has improved luminance and color rendering index.

DESCRIPTION OF DRAWINGS

FIG. 1 illustrates excitation spectra and luminescence spectra when a G element in Formula 1 is C (carbon).

FIG. 2 illustrates excitation spectra and luminescence spectra when a G element in Formula 1 is F.

FIG. 3 illustrates excitation spectra and luminescence spectra when a G element in Formula 1 is Cl.

FIG. 4 illustrates excitation spectra and luminescence spectra when a G element in Formula 1 is Br, FIG. 5 illustrates excitation spectra and luminescence spectra when an element A in Formula 1 is Ba and Mg FIGS. 6 to 9 illustrate a luminescence spectrum according to the amounts of Ba and Mg in Formula 2.

FIG. 10 illustrates a luminescence spectrum according to the amount of K in Formula 3.

FIG. 11 illustrates a luminescence spectrum according to the amount of Li in Formula 3, FIG. 12 illustrates phosphor powder as one embodiment.

FIG. 13 illustrates particle size distribution of a bluish green phosphor as one embodiment with particle size analyzer (PSA).

FIG. 14 is an ingredient distribution graph illustrating an X-ray fluorescence analysis result of a bluish green phosphor as one embodiment.

FIG. 15 illustrates luminescence intensity change of a bluish green phosphor according to temperature as one embodiment.

FIG. 16 illustrates XRD data of a bluish green phosphor as one embodiment.

FIG. 17 illustrates a basic crystal structure model according to an XRD result of a bluish green phosphor of FIG. 16(a).

FIG. 18 illustrates a light emitting device package as one embodiment.

FIG. 19 illustrates a comparison result of light spectra of a white LED device including a bluish green phosphor and a commercially available white LED device, at a color rendering index (CRI) of 90 based on 5000 K as one embodiment.

FIG. 20 illustrates light spectra of a white LED device including a bluish green phosphor and a commercially available white LED device, at a color rendering index (CRI) of 80 at a basis of 5000 K.

FIGS. 21, 23 and 25 each illustrate a light emitting spectrum of a light emitting device package of a comparative example.

FIGS. 22, 24 and 26 each illustrate a light emitting spectrum of a light emitting device package of one embodiment.

FIGS. 27 to 30 each illustrate a light emitting device package as one embodiment.

BEST MODE

Reference will now be made in detail to the preferred embodiments of the present invention, examples of which are illustrated in the accompanying drawings.

In the following description of the embodiments, it will be understood that, when each element is referred to as being "on" or "under" another element, it can be "directly" on or under another element or can be "indirectly" formed such that an intervening element is also present. In addition, terms such as "on" or "under" should be understood on the basis of the drawings.

Terms such as "first", "second", "upper portion", and "lower portion" are not intended to imply that the elements so described must have a given physical or logical relation, or sequence, and are used merely for the purpose of distinguishing one element from another element.

In the drawings, the thicknesses of layers and regions are exaggerated, omitted, or schematically illustrated for clarity. In addition, the sizes of elements do not reflect their actual sizes completely.

A bluish green phosphor according to embodiments of the present invention may be represented by Formula 1 below:

  [Formula 1]

In Formula 1, A is at least one selected from the group consisting of Be, Mg, Ca, Sr, Ba and Ra elements, B is at least one selected from the group consisting of Si, Ge and Sn elements, O means oxygen, N means nitrogen, G is any one of C, Cl, F and Br elements, RE is at least one selected from the group consisting of Eu, Ce, Sm, Er, Yb, Dy, Gd, Tm, Lu, $0<a\leq15$, $0<b\leq15$, $0<c\leq15$, $0<d\leq20$, $0<e\leq10$, and $0<h\leq10$.

FIGS. 1 to 4 illustrate excitation spectra and light emitting spectrum results of one embodiment of the bluish green phosphor having a composition of Formula 1.

In the bluish green phosphor according to Formula 1, for example, a G element may be any one of C, F, Cl and Br elements, and a molar ratio of G, namely, e, may satisfy $0<e\leq6$.

For example, in Formula 1, A may be Ba. In addition, B may be Si and RE may be Eu.

That is, the bluish green phosphor of Formula 1 may be represented by Formula 1-1 below:

  [Formula 1-1]

wherein A is Ba, B is Si, O means oxygen, N mean nitrogen, G is anyone of C, Cl, F and Br elements, C means carbon, RE is Eu, where $0.05\leq a\leq15$, $0.5\leq b\leq15$, $0.1\leq c\leq15$, $0.67\leq d\leq20$, $0<e\leq6$ and $0.01\leq h\leq10$.

That is, one embodiment of the bluish green phosphor represented by Formula 1-1 may be $Ba_aSi_bO_cN_dG_e:Eu_h$.

FIGS. 1 to 4 illustrate light characteristics of embodiments according to Formula 1-1.

For example, FIGS. 1 to 4 are light property results when G in Formula 1-1 is any one of C, F, Cl and Br elements.

Referring to FIGS. 1 to 4, phosphors of examples represented by Formula 1-1 use a wavelength of 300 to 500 nm as an excitation wavelength and thereby may emit a luminescence wavelength of 460 to 540 nm. In addition, a central luminescence wavelength may be 490 to 510 nm. By such luminescence wavelength characteristics, it can be confirmed that the phosphors of the examples are bluish green phosphors.

The blue luminescence phosphor represented by Formula 1 described above has high luminance and narrow half-width, and may realize excellent colors.

FIG. 5 illustrates excitation spectra and luminescence spectra according to the amount of Mg, when, in Formula 1, A includes Ba and Mg.

Referring to FIG. 5, even when, in Formula 1, A includes Ba and Mg, an excitation wavelength is 300 to 500 nm and a luminescence wavelength is 460 to 540 nm. In addition, it can be confirmed that a central luminescence wavelength is 490 to 510 nm.

In addition, as one embodiment, the bluish green phosphor may be represented by Formula 2 below:

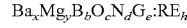  [Formula 2]

In Formula 2, B is at least one selected from the group consisting of Si, Ge and Sn elements, O means oxygen, N means nitrogen, G is any one of C, Cl, F and Br elements, C means carbon, RE is at least one selected from the group consisting of Eu, Ce, Sm, Er, Yb, Dy, Gd, Tm, Lu, Pr, Nd, Pm and Ho, $0.5<x\leq15$, $0<y\leq10$, $0.5<x+y\leq15$, $0<e\leq10$, and $0<h\leq10$.

In Formula 2, B may be Si and RE may be Eu.

The bluish green luminescence phosphor according to Formula 2 may minimize lattice defects in a single phase crystal a single phase crystal structure and, as such, may accomplish high efficiency and improved temperature stability, by transferring $Mg^{2+}$ ions (having an atom radius of 160 pm), which have a smaller radius than $Ba^{2+}$ ions, to lattices of $Ba^{2+}$ cathode ion sites.

In Formula 2, the amount of Mg ions, namely, y, may be greater than 0 and 10 or less. In particular, y may satisfy $0<y\leq2$ in a molar ratio.

When Mg is included with Ba, lattice coupling stability of the phosphor is improved and thereby light properties may be improved. However, when a molar ratio of Mg exceeds 2, improvement of light characteristics due to Mg addition may not be great.

FIG. 5 illustrates excitation spectra and luminescence spectra of an obtained bluish green phosphor when, in Formula 2, Ba and Mg are included in an element A, and the amount of Mg is 0.01 or more and mixed in an amount of less than 2 in a molar ratio.

Referring to FIG. 5, a bluish green phosphor according to an embodiment of the present invention uses a wavelength of 300 to 500 nm as an excitation source, emits a luminescence wavelength of 460 to 540 nm, and has a central luminescence wavelength of 490 to 510 nm.

In Formula 2, a ratio of y, namely, a molar ratio of Mg, to x, namely, a molar ratio of Ba, may satisfy $0<y/x\leq2$. When a molar ratio of the two elements, namely, y/x, exceeds 2, luminescence characteristics outside the luminescence characteristics of the bluish green phosphor may be exhibited.

For example, a value of y/x may satisfy $0<y/x\leq0.4$ and, when a value of y/x exceeds 0.4, a reduction width of a luminous intensity value may be increased. In addition, for example, a value of y/x may satisfy $0<y/x\leq0.1$.

In Formula 2, a molar ratio of Ba, namely, x, may satisfy $0.5<x\leq2.5$, and a molar ratio of Mg, namely, y, may satisfy $0<y\leq2$. In particular, a molar ratio of Mg, namely, y, may satisfy $0<y\leq0.5$. Here, a value of x+y may satisfy $0.5<x+y\leq2.5$.

In addition, in one embodiment according to Formula 2, a molar ratio of Ba, namely, x, may satisfy $1.5<x\leq3.5$, a molar ratio of Mg, namely, y, may satisfy $0<y\leq2.5$. In particular, a molar ratio of Mg, namely, y, may satisfy $0<y\leq0.8$ Here, a value of x+y may satisfy $1.5<x+y\leq3.5$.

In addition, in another embodiment according Formula 2, a molar ratio of Ba, namely, x, may satisfy $3.5<x\leq7.5$, and a molar ratio of Mg, namely, y, may satisfy $0<y\leq5$. In particular, a molar ratio of Mg, namely, y, may satisfy $0<y\leq1.7$. A value of x+y may satisfy $3.5<x+y7.5$.

In addition, in yet another embodiment according to Formula 2, a molar ratio of Ba, namely, x, may satisfy $7.5<x\leq14.5$, and a molar ratio of Mg, namely, y, may satisfy $0<y\leq10$. In particular, a molar ratio of Mg, namely, y, may satisfy $0<y\leq2.5$. Here, a value of x+y may satisfy $7.5<x+y\leq14.5$.

FIGS. 6 to 9 illustrate a luminescence spectrum of embodiments according to Formula 2.

Referring to FIGS. 6 to 9, it can be confirmed that luminous intensity increases with increasing the amount of Mg, but luminous intensity reduces at a certain Mg content range or more.

As another embodiment, the bluish green phosphor may be represented by Formula 3 below:

[Formula 3]

In Formula 3, A is at least one selected from the group consisting of Be, Mg, Ca, Sr, Ba and Ra elements, B is at least one selected from the group consisting of Si, Ge and Sn elements, O means oxygen, N means nitrogen, G is any one of C, Cl, F and Br elements, C means carbon, D is one element or a mixture of two or more elements selected from Li, Na and K, E is at least one selected from the group consisting of P, As, Bi, Sc, Y and Lu, RE is at least one selected from the group consisting of Eu, Ce, Sm, Er, Yb, Dy, Gd, Tm, Lu, Pr, Nd, Pm and Ho, $0<a\leq15$, $0<b\leq15$, $0<c\leq15$, $0<d\leq20$, $0<e\leq10$, $0<f\leq10$, $0<g\leq10$, and $0<h\leq10$.

For example, D in Formula 3 may include at least one of Li and K.

In addition, in Formula 3, E may be P.

For example, in the bluish green luminescence phosphor according to Formula 3, element A includes Ba and Mg, Mg is included in a molar ratio of 0.01 or more and less than 2, element D is K where a molar ratio (f) of K satisfies that $0<f\leq10$, and element E is P where a molar ratio (g) of P satisfies that $0<g\leq10$.

In addition, Formula 3 may include embodiments represented by Formula 3-1 below:

[Formula 3-1]

In Formula 3-1, B is at least one selected from the group consisting of Si, Ge and Sn elements, O means oxygen, N means nitrogen, G is any one of C, Cl, F and Br elements, C means carbon, RE is at least one selected from the group consisting of Eu, Ce, Sm, Er, Yb, Dy, Gd, Tm, Lu, Pr, Nd, Pm and Ho, $0<b\leq15$, $0<c\leq15$, $0<d\leq20$, $0<e\leq10$, $0<h\leq10$, $0.5<x\leq15$, $0<y\leq10$, $0.5<x+y\leq15$, $0<v\leq6$, $0<w\leq6$, and $0<z\leq2$.

For example, a molar ratio of K, namely, w, may satisfy $0<w\leq6$, and a molar ratio of P, namely, g, may satisfy $0<g\leq6$. In particular, a molar ratio of K, namely, w, may satisfy $0.2\leq w\leq0.6$.

FIG. 10 illustrates luminescence wavelength spectra according to the amounts of K in one embodiment of the bluish green phosphor represented by Formula 3-1.

Referring to FIG. 10, a luminous intensity value increases with increasing amount of K, but, when the amount of K is greater than 0.6, luminous intensity is reduced again.

That is, lattice coupling strength of the bluish green phosphor increases by adding K and thereby luminous intensity increases. However, when K is included in an amount of greater than 0.6, K may function as impurities and thereby properties of a phosphor may be deteriorated.

In addition, a molar ratio of P may be greater than 0 and 2 or less, and, for example, a molar ratio of P, namely, z may be greater than 0 and 0.2 or less.

In addition, in Formula 3-1, a G element may be F and a molar ratio of Li may be greater than 0 and 6 or less.

FIG. 11 illustrates luminescence characteristics of one embodiment of the bluish green phosphor according to the amounts of Li.

FIG. 11 illustrates luminescence characteristics of one embodiment of the bluish green phosphor represented by Formula 3-1 according to the amounts of Li.

Referring to FIG. 11, it can be confirmed that light characteristics of the bluish green phosphor are improved with increasing amount of Li but luminous intensity decreases when Li is included in a molar ratio of greater than 1.4.

For example, the amount of Li, namely, v, may satisfy $0<v\leq1.4$, in particular, $0<v\leq1$.

In Formula 3-1, lattice coupling strength of the bluish green phosphor increases by adding Li. However, when Li is included in an amount of greater than 1.4, Li functions as impurities and thereby properties of the phosphor may be deteriorated.

For example, one embodiment of Formula 3-1 may be any one selected from the group consisting of
$Ba_{1.84}Mg_{0.11}Si_{4.95}O_{2.395}N_{8.6}F_{0.32}K_{0.3}P_{0.1}Li_{0.1}:Eu_{0.15}$,
$Ba_{1.84}Mg_{0.11}Si_{4.95}O_{2.395}N_{8.6}F_{0.72}K_{0.3}P_{0.1}Li_{0.5}:Eu_{0.15}$,
$Ba_{2.84}Mg_{0.11}Si_{5.95}O_{3.395}N_{7.93}F_{0.22}K_{0.3}P_{0.1}Li_{0.7}:Eu_{0.15}$,
$Ba_{2.84}Mg_{0.11}Si_{5.9}O_{3.64}N_{7.93}F_{0.67}K_{0.48}P_{0.16}Li_{0.67}:Eu_{0.15}$,
$Ba_{2.79}Mg_{0.11}Si_6O_{3.62}N_8F_{0.66}K_{0.465}P_{0.155}Li_{0.66}:Eu_{0.15}$, and
$Ba_{5.32}Mg_{0.53}Si_{12.1}O_{3.3}N_{8.2}F_{0.67}K_{0.48}P_{0.16}Li_{0.67}:Eu_{0.15}$.

That is, the bluish green luminescence phosphor according to the present invention may include Ba, Mg and the like which may maximize crystallinity, and may further include cations represented by D and anion ingredients represented by G and E in the formula composition to stabilize lattice coupling in crystals generated by combination of N ions and O ions as anions.

For example, in Formula 3, D may be Li and K, G may be F, and E may be P.

FIG. 12 illustrates particle phases of one embodiment of the bluish green phosphor.

For example, one embodiment of the bluish green phosphor illustrated in FIG. 12 may have a composition formula according to Formula 1 and, in particular, may be $Ba_{2.84}Mg_{0.11}Si_{5.95}O_{3.4}N_{8.33}F_{0.22}:Eu_{0.15}$.

The bluish green phosphor of the embodiment described above represented by Formulas 1 to 3 may have a D10 particle size distribution of 1 μm or more and less than 10 μm, a D50 particle size distribution of 10 μm or more 30 μm, and a D90 particle size distribution of 20 μm or more 70 μm.

FIG. 13 illustrates a particle size analysis (PSA) result of one embodiment of the bluish green luminescence phosphor.

The bluish green phosphor of the embodiment may have a D10 particle size distribution of 1 μm or more and less than 10 μm, a D20 particle size distribution of 5 μm or more and less than 15 μm, a D30 particle size distribution of 10 μm or more and less than 20 μm, a D40 particle size distribution of 10 μm or more and less than 25 μm, a D50 particle size distribution of 10 μm or more and less than 30 μm, a D60 particle size distribution of 15 μm or more and less than 30 μm, a D70 particle size distribution of 15 μm or more and less than 35 μm, a D80 particle size distribution of 20 μm or more and less than 40 μm, a D90 particle size distribution of 20 μm or more and less than 70 μm, and a D100 particle size distribution of 25 μm or more and less than 100 μm.

In particular, a D50 particle size is 10 μm or more and less than 30 μm and thus may satisfy particle size distribution required in application to LED package. Meanwhile, when the D50 particle size exceeds 30 μm, precipitation may occur during LED package application.

Accordingly, the bluish green luminescence phosphor of the embodiment may be used as a phosphor suitable for LED package application.

FIG. 14 is an ingredient distribution graph showing an X-ray fluorescence analysis result of the bluish green phosphor as one embodiment.

By FIG. 14, it can be confirmed that the bluish green phosphor of the embodiment includes Ba, Mg, Si, O, N, F and Eu elements.

In addition, FIG. 15 illustrates luminescence intensity change of the bluish green phosphor according to temperature as one embodiment.

Referring to FIG. 15, when temperature reaches 200□, a luminance value of the phosphor of the embodiment reduces is reduced by less than 10%. Accordingly, it can be confirmed that the bluish green phosphor of the embodiment has temperature stability.

The bluish green phosphors of the embodiments described above include $Mg^{2+}$ ions having a relatively small ionic radius and, according to a coupling ratio thereof, a central luminescence wavelength and a crystal structure of a synthesized phosphor may be controlled. In addition, a phosphor having excellent luminescence efficiency, and improved temperature stability and reliability may be provided.

FIG. 16 illustrates XRD data of embodiments of the bluish green phosphor.

In FIGS. 16(a) and (b), A of Formula 1 includes Ba and Mg, and, in (c), A of Formula 1 includes only Mg.

In addition, FIG. 17 schematically illustrates a basic model of a crystal structure according to an XRD results of the bluish green luminescence phosphor having a composition of FIG. 16(a) or (b).

For example, the embodiment of the bluish green phosphor used in FIG. 16 (a) or (b) may be represented by a composition formula of $Ba_{2.84}Mg_{0.11}Si_{5.95}O_{5.4}N_{6.33}F_{0.22}:Eu_{0.15}$, and a basic crystal structure of the bluish green phosphor of the embodiment may be a modified type of an orthorhombic structure (space group Cmcm, #63).

For example, the crystal structure of the bluish green phosphor may have a variety of shapes by atoms coupling set to elevate a sharing degree and thereby lattice coupling may be easily formed.

Accordingly, in an embodiment, some Ba ions may be substituted with Mg ions at cathode ion sites and the anions may be halogen ions, to minimize lattice defects which may occur during processing. That is, as illustrated in FIG. 16, it can be confirmed that crystallinity is improved. Here, reflexibility at a (1,1,1) face with respect to a main peak of crystallinity, namely, a (3,1,1) face may be increased by 30% or more.

On the other hand, the crystal structure of the phosphor of FIG. 16 (c) includes 20% or more of Mg ions and thereby dramatic change such as new phase formation and the like can be confirmed.

Accordingly, the bluish green phosphor of the embodiment may realize maximum luminescence strength when Ba ions and Mg ions are included at the same time.

In the embodiment described above, the bluish green phosphor may have high reliability such as 90% or more of quantum efficiency by controlling a mixing ratio of cations and anions included in Formulas 1 to 3, and improving a process.

A method of preparing the bluish green phosphor of the embodiment may include (1) preparing a starting salt for phosphor preparation by mixing after quantifying a metal salt including divalent metal ions of alkaline earth metals; Si ions; and Eu ions; and (2) heat treating the mixed starting salt at 1000° C. to 1600° C. under a reducing atmosphere formed by providing a reducing gas at a flow rate of 100 to 1000 sccm.

In step (1) of the method of preparing the phosphor of the embodiment, the metal element as a starting salt to form a bluish green luminescence phosphor lattice may optimize a phosphor structure and characteristics by combining elements having different ionic radii among divalent metal ions of alkaline earth metals.

Accordingly, the divalent metal ions of alkaline earth metals may include preferably only $Ba^{2+}$ ions, or $Mg^{2+}$ ions having a relatively small ionic radius with the $Ba^{2+}$ ions.

According to a coupling ratio of $Ba^{2+}$ and $Mg^{2+}$, a central luminescence wavelength and a crystal structure of a synthesized phosphor may be improved, and, accordingly, a bluish green phosphor having excellent efficiency, and superior temperature stability and reliability may be provided.

Here, a compound to generate oxides of metal elements is not specifically limited, but is preferably at least one alkaline earth metal compound selected from alkaline earth metals, which may be easily obtained in a highly pure compound state, may be easily treated in the atmosphere and are relatively cheap, such as carbonates, oxalates, nitrates, sulfates, acetates, oxides, peroxides, and hydroxides.

For example, the alkaline earth metals may be carbonates, oxalates, oxides, hydroxides and fluorides. In particular, the alkaline earth metal compound may be a carbonate. In addition, a phase of the alkaline earth metals compound is not specifically limited, but may be a powder phase to prepare a phosphor having excellent performance.

In Formula 1 described above, a bluish green phosphor may be prepared when the element A as an alkaline earth metals is used in a molar concentration of greater than 0 and 15 or less, and molar concentration of the element A may be the same as or different from molar concentration of oxygen.

As a starting salt to form the bluish green phosphor lattice of the embodiment, at least one selected from the group consisting of Si, Ge and Sn may be used.

For example, a silicon (Si) compound may be used in a molar concentration of greater than 0 and 15 or less. Here, the silicon compound is not specifically limited so long as the silicon compound may be used in a conventional phosphor composition, but the silicon compound is preferably silicon nitride ($Si_3N_4$), silicon diimide ($Si(NH)_2$) or silicon oxide ($SiO_2$) to prepare a phosphor having high performance.

In the phosphor having a composition of Formula 1 of the embodiment, the phosphor may be prepared considering a concentration of a nitrogen element according to a molar ratio of a silicon compound corresponding to the B element.

The bluish green phosphor of the embodiment may use at least one selected from the group consisting of Eu, Ce, Sm, Er, Yb, Dy, Gd, Tm and Lu as an activator. For example, as one embodiment, europium ($Eu^{2+}$) ions may be mixed in a molar concentration of 0.01 to 10 with a starting salt, with respect to a divalent metal including an alkaline earth metal.

In addition, in step (1) of the method of preparing the phosphor of the embodiment, the starting salt may include at least one flux selected from the group consisting of $NH_4Cl$, KCl, $MgCl_2$, $SrCl_2$, $BaCl_2$, $BaF_2$, $SrF_2$, $CaF_2$, $NH_4F$, $H_3BO_3$, $K_3PO_4$ and $KNO_3$.

The flux may be included in an amount of 1 wt % or more and less than 10 wt % based on the total mass of the starting salt.

Here, when the flux is included in an amount of 1 wt %, each compound is not sufficiently mixed and thereby reaction may be incompletely terminated, and, when the flux is included in an amount of 10 wt % or more, the flux functions as impurities to phosphor and thereby it is difficult to clean after reaction.

Subsequently, in step (2), the mixed starting salt may be heat treated at a sintering temperature of 1000° C. to 1600° C. under a reducing gas atmosphere controlled to 100 sccm to 600 sccm.

Here, coloring efficiency is reduced when the sintering temperature is less than 1000° C., and color purity is reduced when the sintering temperature exceeds 1600° C. and, as such, a high quality phosphor may not be produced.

In step (2), the reducing gas atmosphere may be a reducing gas atmosphere formed by mixing nitrogen and hydrogen, and may be formed at normal pressure. For example, the mixed gas may be made of nitrogen and hydrogen in a mixing ratio of 95:5 to 90:10. In particular, sintering time depends on sintering temperature and a supply rate of the mixed gas, and coloring and efficiency of the phosphor may be controlled.

The method described above may be used in Formula 1 as well as Formulas 2 to 3. Here, a mixing process of added cation and anion staring materials may be varied.

The bluish green luminescence phosphors obtained according to the preparation method described above, having composition formulas of Formulas 1 to 3 may be applied to a light emitting device package emitting white light due to light emission characteristics equal or superior to conventional phosphors and excellent temperature characteristics, by optimally combining ingredients of cations and anions in a SiON-based phosphor and optimizing a composition ratio thereof.

Hereinafter, one embodiment of a light emitting device package including the bluish green phosphor of the embodiment described above will be described in conjunction with figures.

One embodiment of a light emitting device package may include at least one light emitting device, and a molding part disposed on the at least one light emitting device and including a phosphor composition, wherein the phosphor composition may include the bluish green phosphor in the embodiment described above.

FIG. 18 illustrates one embodiment of the light emitting device package.

In FIG. 18, the light emitting device package may include a package body 100, a light emitting device 104 disposed on the package body 100, and a molding part 108 surrounding the light emitting device 104 and disposed on the package body 100. In the molding part 108, phosphor compositions 111, 112 and 113 including the bluish green phosphor in the embodiment described above may be disposed.

The package body 100 may be formed including a silicone material, a synthetic resin material, or a metal material, and may be made of a ceramic material having superior thermal conductivity.

The package body 100 may include a lead frame (not shown) to electrically connect to a light emitting device. When a lead frame is formed in the package body 100, the lead frame may be made of a conductive material such as copper and like, and, for example, may be disposed after plating with gold (Au). The lead frame may reflect light emitted from the light emitting device 104.

In the light emitting device 104, a luminescence diode and the like may be disposed.

In one embodiment of the light emitting device package, at least one light emitting device 104 may be included.

The light emitting device may emit blue light or light in an ultraviolet (UV) wavelength area, and may be used as an excitation light source of a phosphor included in a phosphor layer.

In addition, the light emitting devices may emit light in different wavelength areas when a plurality of light emitting devices is included, and, for example, may include a red light emitting device or a green light emitting device.

The light emitting device 104 may be electrically connected to the package body 100 or the lead frame through wires 105 and 106.

The molding part 108 may be formed in a dome type, and may be disposed on the light emitting device.

The molding part 108 may be disposed in a different shape to control a light emission angle of the light emitting device package. The molding part 108 protects surrounding a light emitting device 104 and may function as a lens changing a path of light emitted from the light emitting device 104.

The molding part 108 may include a resin part, and the resin part may include a mixture including any one of a silicone-based resin, an epoxy-based resin and an acrylic resin, or may include a resin selected from the resins.

The light emitting device package 100 of the embodiment may include the bluish green phosphor in the embodiment described above.

Here, a content of the bluish green phosphor may be controlled according to a desired color coordinate and the bluish green phosphor may be included in an amount of 0.1 or more and 99 or less parts by weight based on 100 parts by weight of a silicone resin, an epoxy resin or an encapsulant.

The phosphor composition may further include any one of a green and yellow phosphor, and a red phosphor.

The green phosphor and the yellow phosphor may be a LuAG or YAG phosphor.

For example, the green phosphor or the yellow phosphor may be $(Lu,Gd)_3(Al,Ga)_5O_{12}:Ce^{3+}$ or $(Y,Gd)_3(Al,Ga)_5O_{12}:Ce^{3+}$.

The red phosphor may be $(Sr,Ca)AlSiN_3:Eu^{2+}$ or $(Sr,Ba,Ca)_2Si_5N_8:Eu^{2+}$.

However, any one of the green phosphor and yellow phosphor, and the red phosphor are not limited to any one phosphor type described as embodiments, and may be a variety of phosphors having a green or yellow luminescence wavelength, and a red luminescence wavelength.

The light emitting device package of the embodiment described above including the bluish green phosphor may emit white light.

FIG. 19 illustrates a comparison result of light spectra of a light emitting device package including the bluish green phosphor of the embodiment and a commercially available white LED device at a color rendering index (CRI) of 90 at a color temperature basis of 5000 K.

For example, the bluish green phosphor included in the light emitting device package may be represented by compositions of Formulas 1 to 3, and may be any one selected from the group consisting of $Ba_{2.95}Si_{5.95}O_{3.4}N_{8.33}F_{0.22}:Eu_{0.15}$, $Ba_{2.84}Mg_{0.11}Si_{5.95}O_{5.4}N_{6.33}F_{0.22}:Eu_{0.15}$, and $Ba_{2.79}Mg_{0.11}Si_6O_{3.62}N_8F_{0.66}K_{0.465}P_{0.155}Li_{0.66}:Eu_{0.15}$.

Referring to FIG. 19, a red graph indicates a spectrum of a commercially available white LED device realizing a color rendering index (CRI) of 90 at a color temperature of 5000 K, and a blue graph indicates a light spectrum of the white LED device prepared using the bluish green luminescence phosphor of the embodiment of the present invention. In the white LED device including the bluish green phosphor of the embodiment, a spectrum of a red area reduces and, as such, luminous intensity may be entirely improved.

FIG. 20 illustrates a light spectrum of the white LED device prepared using the bluish green phosphor of the embodiment at a color rendering index (CRI) of 80 under a color temperature basis of 5000 K. It can be confirmed that a light emitting area forms near 500 nm and thereby a color rendering index (CRI) is improved, and, accordingly, a device may realize white light.

Referring to FIG. 20, luminous intensity of the white LED device further including a luminous intensity of the bluish green phosphor of the embodiment with the green phosphor and the red phosphor may be improved by approximately 10% while maintaining a color rendering index (CRI) equal to a commercially available white LED device.

Accordingly, the light emitting device package of the embodiment includes each of the bluish green phosphors described in the embodiments and thereby may have dramatically improved color rendering and luminous intensity while suppressing overuse of red phosphor ingredients, and, accordingly, light emitting strength may be increased and thermal stability may be improved.

In the light emitting device package of the embodiment, the light emitting device may emit light at blue wavelength area, and may be a device emitting UV at 300 to 420 nm or a device emitting blue light at 420 to 480 nm.

The light emitting device emitting UV light or blue light is used as an excitation light source, and the light emitting device may be a GaN light emitting device.

The light emitting device package of the embodiment may include the green or yellow phosphor having a central luminescence wavelength of 510 to 570 nm, the red phosphor having a central luminescence wavelength of 610 to 670 nm, and the bluish green phosphor represented by each of composition formulas of Formulas 1 to 3 in the embodiments described above.

The bluish green phosphor of the embodiment may be excited by light at 300 to 490 nm, and may have a central luminescence wavelength area of 460 to 540 nm.

For example, when a first embodiment of the light emitting device package includes a green or yellow phosphor having a central luminescence wavelength of 525 to 535 nm and a red phosphor having a central luminescence wavelength of 625 to 635 nm, a bluish green (BG) phosphor having each of the composition formulas of Formulas 1 to 3 may have a weight ratio as follows:

$$0 \text{ wt}\% < M < 50 \text{ wt}\%$$

wherein M={mb/(mb+mg+mr)}*100, mb is the weight of the bluish green phosphor, mg is the weight of any one of the green and yellow phosphor, and mr is the weight of the red phosphor.

In addition, when a second embodiment of the light emitting device package includes a green or yellow phosphor having a central luminescence wavelength of 520 to 530 nm and a red phosphor having a central luminescence wavelength of 650 to 665 nm, a bluish green (BG) luminescence phosphor having each of the composition formulas of Formulas 1 to 3 may be included in a weight ratio below:

$$0 \text{ wt}\% < M < 20 \text{ wt}\%$$

wherein M={mb/(mb+mg+mr)}*100, mb is the weight of the bluish green phosphor, mg is the weight of any one of the green and yellow phosphor, and mr is the weight of the red phosphor.

When a third embodiment of the light emitting device package includes a green or yellow phosphor having a central luminescence wavelength of 535 to 545 nm and a red phosphor having a central luminescence wavelength of 650 to 665 nm, a bluish green (BG) luminescence phosphor having each of composition formulas of Formulas 1 to 3 may be included in a weight ratio below:

$$0 \text{ wt}\% < M < 40 \text{ wt}\%$$

wherein, M={mb/(mb+mg+mr)}*100, mb is the weight of the bluish green phosphor, mg is the weight of any one of the green and yellow phosphor, and mr is the weight of the red phosphor.

In addition, in the third embodiment, when the weight ratio of the bluish green phosphor is 5 wt % to 35 wt %, a color rendering index (CRI) of a light emitting device package may be 90 Ra or more and 99 Ra or less.

Each of the first to third embodiments may realize a light emitting device package having a color rendering index (CRI) of 60 Ra or more and 99 Ra or less at a color temperature (CCT) of 2,000 to 10,000 K by including a bluish green phosphor, controlling the amount of the bluish green phosphor, and mixing a large amount of a bluish green color instead of a red color reducing luminous efficiency.

In addition, the light emitting device package of the embodiment may have a light emitting spectrum having peak patterns such as a first peak at 440 to 460 nm, a second peak at 490 to 510 nm, a third peak at 530 to 540 nm and a fourth peak at 650 to 655 nm.

For example, the luminescence spectra illustrated in FIGS. 21, 23 and 25 are luminescence spectra of LED devices manufactured prepared by mixing a conventional green phosphor and red phosphor, without a bluish green phosphor.

For example, FIG. 21 may be a light emitting spectrum of a light emitting device package which is formed by removing a bluish green phosphor from the first embodiment, FIG. 23 may be a light emitting spectrum of a light emitting device package which is formed by removing a bluish green phosphor from the second embodiment, and FIG. 25 may be a light emitting spectrum of a light emitting device package which is formed by removing a bluish green phosphor from the third embodiment.

On the other hand, in FIGS. 22, 24 and 26, it can be confirmed that a light emitting spectrum of a light emitting device package including a bluish green phosphor as described in the first embodiment to third embodiment has a peak pattern such as a first peak at 440 to 460 nm, a second peak at 490 to 510 nm, a third peak at 530 to 540 nm, and a fourth peak at 650 to 655 nm.

For example, FIG. 22 may be a light emitting spectrum of the light emitting device package of the first embodiment, FIG. 24 may be a light emitting spectrum of the light emitting device package of the second embodiment, and FIG. 26 may be a light emitting spectrum of the light emitting device package of the third embodiment.

In the embodiment of the light emitting device package described above, a color rendering index (CRI) of 65 or more and 98 or less is maintained at a color temperature (CCT) of 2700 to 6500 K, and improved luminous intensity characteristics may be exhibited.

For example, the embodiment of the light emitting device package includes an LED package which is manufactured in a dispersive type wherein a green phosphor, a red phosphor and a bluish green luminescence phosphor are dispersed on a light emitting device; a conformal type; or a remote type.

FIG. 27 is a schematic diagram of a white LED device manufactured in a dispersive type, in which a phosphor is dispersed over a light emitting device, and the white LED device is manufactured using a conventional method.

FIG. 28 illustrates one embodiment of a light emitting device package in which a phosphor composition is coated over a light emitting device in a conformal type. Here, the phosphor may be formed adjacent to the light emitting device.

FIG. 29 illustrates one embodiment of a phosphor disposed in a remote type. In the embodiment of FIG. 29, the phosphor layer of a remote type may be made of a plate of a ceramic, a polymer, phosphor in glass (PIG), or the like.

As illustrated in FIG. 30, another embodiment of the light emitting device package may be formed by hardening after spreading a phosphor composition over a light emitting device in a spray manner.

The light emitting device package of the embodiment described above may be included as a light source of a lighting apparatus.

For example, the light emitting device packages of the embodiments have superior luminance and color rendering, and thereby may be used as a light source in an electronic part selected from the group consisting of camera flashes, laptops, mobiles, smart phones, back light units for TV, and displays.

Alternatively, the light emitting device packages of the embodiments may be included in a variety of lighting products or light sources such as headlamps for vehicles, interior lights, outdoor lights, streetlights, electric sign lights, lights for electronic scoreboards, light sources for pharmaceutical purposes, light sources for exhibition areas, and agricultural light sources, and the like.

Hereinafter, the present invention will be described in more detail in conjunction with examples below.

Examples below are intended to more particularly explain the present invention and the present invention should not be limited to the examples.

<Example 1> Preparation of Bluish Green Phosphor and Property Evaluation

Each of starting salts, such as $BaCO_3$, $Si_3N_4$, $Eu_2O_3$ and the like was quantified and then was put into a ball mill container. Subsequently, the starting salt was ball-milled for 8 to 24 hours using isopropyl alcohol as a solvent and then was dried. Subsequently, a dried starting salt was sintered for 3 hours at 1300° C. temperature under a reducing atmosphere in which hydrogen gas was controlled with a flow rate of 100 sccm, resulting in preparation of a phosphor. Here, a flux was used.

Tables 1 to 4 summarize light property results of embodiments represented by composition formulas of Formula 1.

Tables 1 to 4 show properties of phosphors prepared according to a molar ratio of each of element ions in composition formulas of $Ba_aSi_bO_cN_dG_e:Eu_h$.

TABLE 1

| Ratio | Composition $0.01 \leq e \leq 0.1$ | Luminance (Brightness, %) | Central wavelength (nm) | Full width at Half-maximum (nm) | Color coordinate (Cx, Cy) |
|---|---|---|---|---|---|
| C = 0.01 | $Ba_{2.9}Si_6O_3N_8C_{0.01}:Eu_{0.1}$ | 100 | 495 | 30 | 0.068, 0.480 |
| C = 0.1 | $Ba_{2.9}Si_6O_3N_8C_{0.1}:Eu_{0.1}$ | 97 | 495 | 30 | 0.068, 0.489 |
| C = 1 | $Ba_{2.9}Si_6O_3N_8C_1:Eu_{0.1}$ | 95 | 496 | 30 | 0.068, 0.478 |

TABLE 1-continued

| Ratio | Composition $0.01 \leq e \leq 0.1$ | Luminance (Brightness, %) | Central wavelength (nm) | Full width at Half-maximum (nm) | Color coordinate (Cx, Cy) |
|---|---|---|---|---|---|
| C = 5 | $Ba_{2.9}Si_6O_3N_8C_5:Eu_{0.1}$ | 87 | 495 | 31 | 0.068, 0.477 |
| C = 10 | $Ba_{2.9}Si_6O_3N_8C_{10}:Eu_{0.1}$ | 70 | 494 | 33 | 0.068, 0.473 |

TABLE 2

| Ratio | Composition $0.01 \leq e \leq 0.1$ | Luminance (Brightness, %) | Central wavelength (nm) | Full width at Half-maximum (nm) | Color coordinate (Cx, Cy) |
|---|---|---|---|---|---|
| F = 0.01 | $Ba_{2.9}Si_6O_3N_8F_{0.01}:Eu_{0.1}$ | 100 | 495 | 30 | 0.068, 0.480 |
| F = 0.1 | $Ba_{2.9}Si_6O_3N_8F_{0.1}:Eu_{0.1}$ | 99 | 495 | 30 | 0.068, 0.479 |
| F = 1 | $Ba_{2.9}Si_6O_3N_8F_1:Eu_{0.1}$ | 98 | 496 | 30 | 0.069, 0.480 |
| F = 5 | $Ba_{2.9}Si_6O_3N_8F_5:Eu_{0.1}$ | 95 | 496 | 30 | 0.069, 0.478 |
| F = 10 | $Ba_{2.9}Si_6O_3N_8F_{10}:Eu_{0.1}$ | 92 | 496 | 30 | 0.068, 0.478 |

TABLE 3

| Ratio | Composition $0.01 \leq e \leq 0.1$ | Luminance (Brightness, %) | Central wavelength (nm) | Full width at Half-maximum (nm) | Color coordinate (Cx, Cy) |
|---|---|---|---|---|---|
| Cl = 0.01 | $Ba_{2.9}Si_6O_3N_8Cl_{0.01}:Eu_{0.1}$ | 100 | 495 | 30 | 0.068, 0.480 |
| Cl = 0.1 | $Ba_{2.9}Si_6O_3N_8Cl_{0.1}:Eu_{0.1}$ | 97 | 495 | 30 | 0.069, 0.479 |
| Cl = 1 | $Ba_{2.9}Si_6O_3N_8Cl_1:Eu_{0.1}$ | 99 | 496 | 30 | 0.069, 0.480 |
| Cl = 5 | $Ba_{2.9}Si_6O_3N_8Cl_5:Eu_{0.1}$ | 97 | 495 | 30 | 0.069, 0.479 |
| Cl = 10 | $Ba_{2.9}Si_6O_3N_8Cl_{10}:Eu_{0.1}$ | 95 | 494 | 30 | 0.068, 0.479 |

TABLE 4

| Ratio | Composition $0.01 \leq e \leq 10$ | Luminance (Brightness, %) | Central wavelength (nm) | Full width at Half-maximum (nm) | Color coordinate (Cx, Cy) |
|---|---|---|---|---|---|
| Br = 0.01 | $Ba_{2.9}Si_6O_3N_8Br_{0.01}:Eu_{0.1}$ | 100 | 495 | 30 | 0.068, 0.480 |
| Br = 0.1 | $Ba_{2.9}Si_6O_3N_8Br_{0.1}:Eu_{0.1}$ | 93 | 495 | 30 | 0.068, 0.479 |
| Br = 1 | $Ba_{2.9}Si_6O_3N_8Br_1:Eu_{0.1}$ | 90 | 494 | 30 | 0.069, 0.478 |
| Br = 5 | $Ba_{2.9}Si_6O_3N_8Br_5:Eu_{0.1}$ | 82 | 492 | 32 | 0.067, 0.476 |
| Br = 10 | $Ba_{2.9}Si_6O_3N_8cBr_{10}:Eu_{0.1}$ | 65 | 491 | 34 | 0.066, 0.472 |

From phosphor property evaluations of Tables 1 to 4 and excitation spectrum and luminous spectrum characteristics of a phosphor obtained from each of composition formulas of Formula 1 in FIGS. 1 to 4, it can be confirmed that a phosphor prepared according to ingredients of cations and anions, and a composition ratio thereof uses a wavelength area of 300 to 500 nm as an excitation source, emits a luminescence wavelength of 460 to 540 nm, and is a bluish green luminescence phosphor having a central luminescence wavelength of 490 to 500 nm.

Table 5 shows embodiments of bluish green phosphors when A is Ba, B is Si, G is F, and RE is Eu in Formula 1.

That is, Table 5 shows light characteristics of the embodiments when, in $Ba_aSi_bO_cN_dF_e:Eu_g$, satisfies that $0<a\leq15$. In the formula, b may satisfy $5\leq b\leq15$, c may satisfy $2\leq c\leq7$, d may satisfy $5\leq d\leq20$, e may satisfy $0<e\leq1$, and g may satisfy $0<g\leq1$.

For example, in Examples 1-1 to 1-4, only the amount of Ba is varied and the amounts of the other ingredients are fixed.

TABLE 5

| Classification | Central luminescence wavelength (nm) | Luminous intensity |
|---|---|---|
| Example 1-1 | 495.6 | 33.3 |
| Example 1-2 | 495.6 | 34.4 |
| Example 1-3 | 495.6 | 34.1 |
| Example 1-4 | 495.6 | 31.3 |

Referring to Table 5, it can be confirmed that a bluish green phosphor having superior luminous intensity may be realized when, in Formula 1, a molar ratio of Ba, namely, a, satisfies that $0<a\leq15$.

<Example 2> Preparation of Bluish Green Phosphor and Property Evaluation

Phosphors were prepared in the same manner as in Example 1 except that $BaCO_3$, $MgF_2$, $Si_3N_4$ and $Eu_2O_3$ disclosed in Tables 6 to 9 below were used.

Properties of the prepared phosphors are summarized in Tables 6 to 9 below.

Tables 6 to 9 show light properties of bluish green phosphors prepared by varying composition ratios of Ba and Mg with respect to embodiments represented by Formula 2.

In Tables 6 to 9, luminous intensity means a luminescence peak area in a luminescence spectrum and may correspond to a measured total light emitting amount of a phosphor.

The embodiments of Tables 6 to 9 have a composition formula of Formula 2 and, for example, may be $Ba_xMg_ySi_bO_cN_dF_e:Eu_g$ where $5 \le b \le 15$, $2 \le c \le 7$, $5 \le d \le 20$, $0 < e \le 1$, and $0 < g \le 1$.

Table 6 shows light characteristic values measured by controlling composition ratios of Ba and Mg in $Ba_xMg_ySi_{5.45}O_{2.8}N_7F_{0.22}:Eu_{0.15}$.

Referring to Table 6, in Formula 2, a molar ratio of Ba may be greater than 0.5 and 2.5 or less, a molar ratio of Mg may be greater than 0 and 2 or less, and a value of x+y in Formula 2 may satisfy $0.5 < x+y \le 2.5$.

In addition, for example, a molar ratio of Mg may be greater than 0 and 0.5 or less.

TABLE 6

| Classification | Central luminescence wavelength(nm) | Luminous intensity | Full width at half maximum (nm) |
| --- | --- | --- | --- |
| Example 2-1 | 495.6 | 33.4 | 29.6 |
| Example 2-2 | 495.6 | 35.2 | 30.6 |
| Example 2-3 | 495.6 | 36.8 | 30.6 |
| Example 2-4 | 495.6 | 34.8 | 30.6 |
| Example 2-5 | 495.6 | 33.7 | 30.6 |
| Example 2-6 | 495.6 | 32.8 | 30.6 |
| Example 2-7 | 495.6 | 30.8 | 30.6 |
| Example 2-8 | 495.6 | 25.5 | 31.6 |
| Example 2-9 | 495.6 | 21.5 | 29.6 |
| Example 2-10 | 495.6 | 15.5 | 30.6 |

FIG. 6 illustrates luminescence wavelength characteristics of bluish green phosphors having composition formulas of the embodiments of Table 6.

Referring to Table 6 and FIG. 6, the embodiments of Table 6 represented by the composition formulas of Formula 2 may be bluish green phosphors having central luminescence wavelength of 490 nm to 500 nm.

Referring to FIG. 6, it can be confirmed that a luminous intensity value increases with increasing amount of Mg, but, when the amount of Mg is 0.5 or more, luminous intensity reduction increases.

As confirmed in Table 6, a bluish green luminescence phosphor having a central luminescence wavelength of 495 nm was prepared and, through the property evaluations such as luminance and half-width, it can be confirmed that Ba ion sites are filled with Mg ions and thereby crystallinity is stabilized.

Table 7 shows light characteristics measured after controlling composition ratios of Ba and Mg in $Ba_xMg_ySi_{5.45}O_{2.8}N_7F_{0.22}:Eu_{0.15}$.

In the embodiments of Formula 2 used in Table 7, a molar ratio of Ba may be greater than 1.5 and 3.5 or, less, a molar ratio of Mg may be greater than 0 and 2.5 or less, a value of x+y in Formula 2 may be greater than 1.5 and 3.5 or less.

For example, a molar ratio of Mg may be greater than 0 and 0.8 or less.

TABLE 7

| Classification | Central luminescence wavelength(nm) | Luminous intensity | Full width at half maximum (nm) |
| --- | --- | --- | --- |
| Example 2-11 | 495.6 | 34.4 | 30.6 |
| Example 2-12 | 495.6 | 36.4 | 30.6 |
| Example 2-13 | 495.6 | 37.6 | 30.6 |
| Example 2-14 | 495.6 | 35.4 | 30.6 |
| Example 2-15 | 495.6 | 34.7 | 30.6 |
| Example 2-16 | 495.6 | 33.5 | 30.6 |
| Example 2-17 | 495.6 | 32.9 | 30.6 |
| Example 2-18 | 495.6 | 31.5 | 30.6 |
| Example 2-19 | 494.6 | 24.8 | 29.6 |
| Example 2-20 | 498.6 | 17.4 | 30.6 |

FIG. 7 illustrates luminescence wavelength characteristics of bluish green phosphors having composition formulas of embodiments in Table 7.

Referring to FIG. 7, it can be confirmed that a luminous intensity value increases with increasing the amount of Mg, but, when a Mg value is greater than 0.8, luminous intensity reduction increases.

Table 8 shows light characteristics measured after controlling composition ratios of Ba and Mg in $Ba_xMg_ySi_{12.1}O_{3.3}N_{18}F_{0.22}:Eu_{0.15}$.

In the embodiments of Formula 2 used in Table 8, a molar ratio of Ba may be greater than 3.5 and 7.5 or less, a molar ratio of Mg may be greater than 0 and 5 or less, and a value of x+y in Formula 2 may be greater than 3.5 and 7.5 or less.

TABLE 8

| Classification | Central luminescence wavelength (nm) | Luminous intensity | Full width at half maximum (nm) |
| --- | --- | --- | --- |
| Example 2-21 | 495.6 | 34.1 | 30.6 |
| Example 2-22 | 495.6 | 34.1 | 30.6 |
| Example 2-23 | 495.6 | 34.8 | 30.6 |
| Example 2-24 | 495.6 | 35.1 | 30.6 |
| Example 2-25 | 495.6 | 35.4 | 30.6 |
| Example 2-26 | 495.6 | 35.5 | 30.6 |
| Example 2-27 | 495.6 | 36.1 | 30.6 |
| Example 2-28 | 495.6 | 35.2 | 30.6 |
| Example 2-29 | 495.6 | 34.1 | 30.6 |
| Example 2-30 | 495.6 | 31 | 30.6 |

FIG. 8 illustrates luminescence wavelength characteristics of bluish green phosphors having composition formulas of embodiments in Table 8.

For example, referring to Table 8 and FIG. 8, it can be confirmed that a molar ratio of Mg, namely, y, may be greater than 0 and 1.7 or less, and, although luminous intensity increases with increasing amount of Mg, a luminous intensity is maximized when the amount of Mg is 0.5 and luminous intensity reduces again when the amount of Mg is greater than 0.5 in the embodiments.

Table 9 shows light characteristics measured after controlling composition ratios of Ba and Mg in $Ba_xMg_ySi_{14.95}O_{5.3}N_{19.9}F_{0.67}:Eu_{0.15}$.

In embodiments of Formula 2 used in Table 9, a molar ratio of Ba may be greater than 7.5 and 14.5 or less, a molar ratio of Mg may be greater than 0 and 10 or less, and a value of x+y in Formula 2 may be greater than 7.5 and 14.5 or less.

TABLE 9

| Classification | Central luminescence wavelength(nm) | Luminous intensity | Full width at Half-maximum (nm) |
|---|---|---|---|
| Example 2-31 | 495.6 | 31.5 | 30.6 |
| Example 2-32 | 495.6 | 31.7 | 30.6 |
| Example 2-33 | 495.6 | 32 | 30.6 |
| Example 2-34 | 495.6 | 32.7 | 30.6 |
| Example 2-35 | 495.6 | 32.8 | 30.6 |
| Example 2-36 | 495.6 | 33 | 30.6 |
| Example 2-37 | 495.6 | 34.1 | 30.6 |
| Example 2-38 | 495.6 | 35.4 | 30.6 |
| Example 2-39 | 494.6 | 36.8 | 29.6 |
| Example 2-40 | 498.6 | 35.1 | 30.6 |

FIG. 9 illustrates luminescence wavelength characteristics of bluish green phosphors having composition formulas of embodiments in Table 9.

For example, referring to Table 9 and FIG. 9 it can be confirmed that, a molar ratio of Mg, namely, y, may be greater than 0 and 2.5 or less, and, although luminous intensity increases with increasing amount of Mg, luminous intensity reduces when the amount of Mg is 1.5 or more in the embodiments.

Tables 6 to 9 show embodiments in which ratios of Ba and Mg are varied. However, molar ratios of Ba and Mg in the bluish green phosphors of the embodiments represented by Formula 2 are not limited to those shown in the tables.

Referring to the embodiments of Tables 6 to 9, when a molar ratio of Ba, namely, x, satisfies that $0.5 < x \le 14.5$, a molar ratio of Mg, namely, y, may satisfy $0 < y \le 10$ and a value of x+y may satisfy $0.5 < x+y \le 14.5$.

For example, when a molar ratio of Ba, namely, x satisfies that $2 \le x \le 5$, a molar ratio of Mg, namely, y, satisfy $0 < y \le 2$, and, when $2 < x+y \le 7$, the bluish green phosphor of the embodiment may exhibit excellent luminescence characteristics.

However, molar ratios of Ba and Mg in embodiments of Formula 2 are not limited thereto and values of x and y may different from the above ratios.

Referring to the embodiments of Tables 6 to 9, when a phosphor includes Ba and Mg, the phosphor may have bluish green luminescence wavelength characteristics and improved luminous intensity.

In addition, luminous intensity of the bluish green phosphor may be improved by increasing the amount of Mg with respect to Ba.

That is, by adding $Mg^{2+}$ in addition to $Ba^{2+}$ as divalent cations, $Mg^{2+}$ ions (having an atomic radius of 160 pm) having a smaller ionic radius than $Ba^{2+}$ ions are transferred to a lattice and, as such, a crystal structure may be formed.

By including Mg having a smaller ionic radius, lattice defects in a single phase crystal structure of a bluish green phosphor including Ba and Mg are minimized and, as such, high luminous efficiency and temperature stability may be exhibited.

Referring to FIGS. 6 to 9, each of the bluish green phosphors represented by Formula 2 has a luminescence wavelength of 460 nm to 540 nm and has a luminescence peak central wavelength of 490 nm to 500 nm.

The bluish green luminescence phosphor of the embodiments may include Ba, Mg and the like to maximize crystallinity, and composition ratios of added cation and anion ingredients may be optimized while controlling composition ratios of Ba and Mg.

For example, cations and anions are added and a composition ratio thereof may be optimized to stabilize lattice coupling in a crystal generated by combining N ions and O ions as anions.

<Example 3> Preparation of Bluish Green Phosphor and Property Evaluation

Phosphors were prepared in the same manner as in Example 1, except that $BaCO_3$, $MgF_2$, $Si_3N_4$, $Eu_2O_3$ and $K_3PO_4$ disclosed in Table 10 below were used.

Properties of prepared phosphors are summarized in Tables 6 to 9 below.

Table 10 shows light properties of bluish green phosphors in which composition ratios of K and P are varied with respect to embodiments represented by Formula 3.

In Table 10, luminous intensity indicates a luminescence peak area in a luminescence spectrum and may correspond to measured total light emission of a phosphor.

TABLE 10

| Classification | Central luminescence wavelength (nm) | Luminous intensity | Full width at half maximum (nm) |
|---|---|---|---|
| Example 3-1 | 493.6 | 19.0 | 31.4 |
| Example 3-2 | 494.6 | 30.2 | 31.4 |
| Example 3-3 | 495.6 | 36 | 31.0 |
| Example 3-4 | 495.6 | 36.8 | 31.2 |
| Example 3-5 | 496.6 | 28.7 | 32.0 |
| Example 3-6 | 496.6 | 29.8 | 31.4 |

Embodiments shown in Table 10 may be represented by a composition formula of Formula 3, and, for example, may be represented by a composition formula of $Ba_xMg_ySi_bO_cN_dF_eK_wP_z:Eu_h$.

Table 10 shows light characteristic values measured after controlling the amounts of K and P and fixing the amounts of the other ingredients in a composition formula of $Ba_xMg_ySi_bO_cN_dF_eK_wP_z:Eu_h$.

For example, the embodiments of Table 10 may satisfy $0.5 < x \le 15$, $0 < y \le 10$, $0.5 < x+y \le 15$, $5 \le b \le 15$, $2 \le c \le 7$, $5 \le d \le 20$, $0 < e \le 1$, and $0 < h \le 1$ in $Ba_xMg_ySi_bO_cN_dF_eK_wP_z:Eu_h$.

Referring to Table 10, a molar ratio of K may be greater than 0 and 6 or less, and a molar ratio of P may be greater than 0 and 2 or less in Formula 2.

For example, a molar ratio of K may be 0.2 or more and 0.6 or less.

FIG. 10 illustrates luminescence wavelength characteristics of bluish green phosphors having the composition formulas of the embodiments of Table 10.

Referring to Table 10 and FIG. 10, it can be confirmed that luminous intensity changes according to the amount of K and, when the amount of K is 0.6 mol or less, a luminous intensity value increases with increasing amount of K, but, when a molar ratio of K is greater than 0.6 mol, luminous intensity reduction increases.

In addition, referring to FIG. 10, it can be confirmed that the embodiments have bluish green luminescence characteristics at a central luminescence wavelength of 490 nm to 500 nm.

As confirmed in Table 10, a bluish green luminescence phosphor having a central luminescence wavelength of 492 to 495 nm, and, by adding K, lattice coupling of the bluish green phosphor becomes stronger and, as such, the bluish green phosphor of the embodiment may have improved light characteristics and thermal stability.

Meanwhile, in the embodiment of Table 10, for example, the amount of P may be greater than 0 and 0.2 or less.

<Example 4> Preparation of Bluish Green Phosphor and Property Evaluation

Phosphors were prepared in the same manner as in Example 1, except that $BaCO_3$, $MgF_2$, $Si_3N_4$, $Eu_2O_3$, $K_3PO_4$ and LIF disclosed in Table 11 below were used.

Table 11 shows properties of prepared phosphors having a composition ratio of Formula 2.

Table 11 shows light properties of bluish green phosphors in which the amounts of Li and F are varied with respect to embodiments represented by Formula 3.

In Table 11, luminous intensity indicates a luminescence peak area in a luminescence spectrum and may correspond to measured total light emission of a phosphor.

TABLE 11

| Classification | Central luminescence wavelength (nm) | Luminous intensity | Full width at half maximum (nm) |
|---|---|---|---|
| Example 4-1 | 494.6 | 38.4 | 31.4 |
| Example 4-2 | 494.6 | 39.2 | 31.4 |
| Example 4-3 | 495.6 | 39.6 | 31.4 |
| Example 4-4 | 496.6 | 40.7 | 31.6 |
| Example 4-5 | 495.6 | 37.7 | 31.4 |
| Example 4-6 | 494.6 | 34.7 | 31.4 |
| Example 4-7 | 494.6 | 30.3 | 31.4 |
| Example 4-8 | 494.6 | 25.5 | 31.4 |
| Example 4-9 | 494.6 | 19.2 | 31.4 |

For example, a composition formula of Formula 3 may be represented by $Ba_xMg_ySi_bO_cN_dF_eK_wP_zLi_v:Eu_h$ and Table 11 shows light characteristic values measured after controlling the amounts of Li and F and fixing the amounts of the other ingredients in a composition formula of $Ba_xMg_ySi_bO_cN_dF_eK_wP_zLi_v:Eu_h$.

For example, a composition formula of Formula 3 as an embodiment of Table 10 may be $Ba_xMg_ySi_bO_cN_dF_eK_wP_zLi_v:Eu_h$, where $0.5<x\leq15$, $0<y\leq10$, $0<x+y\leq15$, $5\leq b\leq15$, $2\leq c\leq7$, $5\leq d\leq20$, $0<e\leq1$, $0<h\leq1$, $0<w\leq6$, and $0<z\leq2$.

Referring to Table 11, a molar ratio of Li may be greater than 0 and 6 or less, and a molar ratio of F may be greater than 0 and 6 or less in Formula 3.

For example, the amount of Li may be greater than 0 and 1.4 or less.

FIG. 11 illustrates luminescence wavelength characteristics of bluish green phosphors having the composition formulas of the embodiments of Table 11.

Referring to Table 11 and FIG. 11, it can be confirmed that luminous intensity changes according to the amounts of Li and F and, when the amount of LiF is 1.4 mol or less, a luminous intensity value increases with increasing amount of KiF, but, when a molar ratio of LiF is greater than 1.4, luminous intensity reduction increases.

In addition, referring to FIG. 11, it can be confirmed that the embodiments have bluish green luminescence characteristics at a central luminescence wavelength of 490 nm to 500 nm.

As confirmed in Table 11, bluish green luminescence phosphors having a central luminescence wavelength of 492 to 495 nm were prepared, and, by adding Li, lattice coupling of the bluish green phosphors becomes stronger and, as such, the bluish green phosphors of the embodiments may have improved light characteristics and thermal stability.

<Experimental Example 1> Particle Size Distribution (PSA) Measurement of Phosphors FIG. 13 illustrates particle size distribution (PSA) of the bluish green luminescence phosphor of the embodiment. For example, a phosphor used in an experimental example to measure particle size distribution may be represented by a composition formula of $Ba_{2.84}Mg_{0.11}Si_{5.95}O_{3.4}N_{8.33}F_{0.22}:Eu_{0.15}$. Particular results are summarized in Table 10 below.

From results of Table 12 below, it can be confirmed that the bluish green luminescence phosphor according to the present invention has particle size distribution data with particle size analyzer (PSA) as follows: a D10 particle size distribution of 1 μm or more and less than 10 μm, a D20 particle size distribution of 5 μm or more and less than 15 μm, a D30 particle size distribution of 10 μm or more and less than 20 μm, a D40 particle size distribution of 10 μm or more and less than 25 μm, a D50 particle size distribution of 10 μm or more and less than 30 μm, a D60 particle size distribution of 15 μm or more and less than 30 μm, a D70 particle size distribution of 15 μm or more and less than 35 μm, a D80 particle size distribution of 20 μm or more and less than 40 μm, a D90 particle size distribution of 20 μm or more and less than 70 μm, and a D100 particle size distribution of 25 μm or more and less than 100 μm.

TABLE 12

| % Tile | Particle size (μm) |
|---|---|
| 10.00 | 8.52 |
| 20.00 | 10.81 |
| 30.00 | 12.59 |
| 40.00 | 14.20 |
| 50.00 | 15.81 |
| 60.00 | 17.56 |
| 70.00 | 19.66 |
| 80.00 | 22.53 |
| 90.00 | 22.72 |
| 100.00 | 73.41 |

<Experimental Example 2> EDX Analysis of Phosphors

The bluish green luminescence phosphor of the embodiment of the present invention was analyzed using energy dispersive spectrometry (EDX) (Thermo, Noran).

As results of EDX analysis, Wt % and At % of ingredients included in the bluish green luminescence phosphor of the present invention were summarized in Table 13 below, and the results are illustrated in FIG. 14.

TABLE 13

| Element | Wt % | Particle size (μm) |
|---|---|---|
| N | 3.98 | 15.08 |
| O | 4.85 | 16.12 |
| F | 1.65 | 4.62 |
| Mg | 1.31 | 2.87 |
| Si | 18.12 | 34.27 |
| Ba | 68.04 | 26.32 |
| Eu | 2.05 | 0.72 |

As shown in Table 13, when the bluish green luminescence phosphor of the present invention was quantitatively analyzed through X-ray fluorescence analysis, presence of Ba, Mg, Si, O, N, F and Eu elements was confirmed. More particularly, it can be confirmed that a phosphor, where $20 \leq Ba \leq 35$, $1 \leq Mg \leq 10$, $25 \leq Si \leq 45$, $10 \leq O \leq 20$, $10 \leq N \leq 20$, $1 \leq F \leq 10$ and $0.1 \leq Eu \leq 5$ with respect to At % of each element, and a total At % of elements is 100, was prepared.

<Example 5> Embodiments of Light Emitting Device Package Including Bluish Green (BG) Phosphor <Examples 5-1 to 5-4> Manufacture of Light Emitting Device Packages as First Embodiment A phosphor composition included in a light emitting device package as a first embodiment may include a LuAG-based phosphor, namely, $(Lu,Gd)_3(Al,Ga)_5O_{12}:Ce^{3+}$, having a central luminescence wavelength of 525 to 535 nm as a green phosphor, $(Sr,Ca)AlSiN_3:Eu^{2+}$ having a central luminescence wavelength of 625 to 635 nm as a red phosphor, and a bluish green phosphor (BG) according to Formula 3. For example, in a composition formula of Formula 3, A may be Ba and Mg, B may be Si, G may be F, D may include Li and K, E may be P, and RE may be Eu.

After mixing the green phosphor, the red phosphor and the bluish green phosphor in ratios disclosed in Table 14, the mixture was coated or disposed in a thin layer type on light emitting devices emitting ultraviolet or blue light as an excitation source and then was fixed by hardening for 1 hour at 100 to 160° C.

Comparative Examples 1 to 2

Light emitting device packages of comparative examples were manufactured in the same manner as in Examples 5-1 to 5-4, except that phosphors were mixed in ratios disclosed in Table 14 below.

TABLE 14

| Classification | Ratios of phosphors | | | |
| --- | --- | --- | --- | --- |
| | BG | LuAG-1 (525 nm to 535 nm) | (Sr,Ca)AlSiN3-1 (625 nm to 635 nm) | Total(%) |
| Comparative Example 1 | 0 | 90 | 10 | 100 |
| Example 5-1 | 5 | 85 | 10 | 100 |
| Example 5-2 | 10 | 80 | 10 | 100 |
| Example 5-3 | 15 | 75 | 10 | 100 |
| Example 5-4 | 20 | 70 | 10 | 100 |
| Comparative Example 2 | 25 | 65 | 10 | 100 |

<Examples 5-5 to 5-6> Manufacture of Light Emitting Device Packages as Second Embodiment A phosphor composition included in a light emitting device package as a second embodiment may include a LuAG-based phosphor, namely, $(Lu,Gd)_3(Al,Ga)_5O_{12}:Ce^{3+}$, having a central luminescence wavelength of 520 to 530 nm as a green phosphor, $(Sr,Ca)AlSiN_3:Eu^{2+}$ having a central luminescence wavelength of 650 to 665 nm as a red phosphor, and one embodiment of a bluish green phosphor (BG) having a composition formula of Formula 3.

After mixing the green phosphor, the red phosphor and the bluish green phosphor in ratios disclosed in Table 15, the mixture was coated or disposed in a thin layer type on light emitting devices emitting ultraviolet or blue light as an excitation source and then was fixed by hardening for 1 hour at 100 to 160° C.

Comparative Example 3

A light emitting device package of a comparative example was manufactured in the same manner as in Example 5-5, except that phosphors were mixed in ratios disclosed in Table 15 below.

TABLE 15

| Classification | Ratios of phosphors | | | |
| --- | --- | --- | --- | --- |
| | BG | LuAG-2 (520 nm~530 nm) | (Sr,Ca)AlSiN3-2 (650 nm~665 nm) | Total(%) |
| Comparative Example 3 | 0 | 90 | 10 | 100 |
| Example 5-5 | 5 | 85 | 10 | 100 |
| Example 5-6 | 10 | 80 | 10 | 100 |

<Examples 5-7 to 5-10> Manufacture of Light Emitting Device Packages as Third Embodiment A phosphor composition included in a light emitting device package as a third embodiment may include a LuAG-based phosphor, namely, $(Lu,Gd)_3(Al,Ga)_5O_{12}:Ce^{3+}$, having a central luminescence wavelength of 535 to 545 nm as a green phosphor, $(Sr,Ca)AlSiN_3:Eu^{2+}$ having a central luminescence wavelength of 650 to 665 nm as a red phosphor, and one embodiment of a bluish green phosphor (BG) having a composition formula of Formula 3.

After mixing the green phosphor, the red phosphor and the bluish green phosphor in ratios disclosed in Table 16, the mixture was coated or disposed in a thin layer type on light emitting device emitting ultraviolet or blue light as an excitation source and then was fixed by hardening for 1 hour at 100 to 160° C.

Comparative Example 4

A light emitting device package of a comparative example was manufactured in the same manner as in Example 5-7, except that phosphors were mixed in ratios disclosed in Table 16 below.

TABLE 16

| Classification | Ratios of phosphors | | | |
| --- | --- | --- | --- | --- |
| | BG | LuAG-3 (535 nm to 545 nm) | (Sr,Ca)AlSiN3-3 (650 nm~665 nm) | Total(%) |
| Comparative Example 4 | 0 | 90 | 10 | 100 |
| Example 5-7 | 5 | 85 | 10 | 100 |
| Example 5-8 | 10 | 80 | 10 | 100 |
| Example 5-9 | 15 | 75 | 10 | 100 |
| Example 5-10 | 20 | 70 | 10 | 100 |

<Experimental Example 1> Measurement of Color Rendering Indexes (CRI)

Color rendering indexes (CRI) of the white light emitting device packages manufactured above and a commercially available LED device were measured.

Color rendering index (CRI) is a quantitative measure of the ability of a light source to reveal the colors of various objects faithfully in comparison with an ideal light source. The color rendering index is preferably as close as possible to 100. Results are summarized in Tables 17 to 19.

TABLE 17

| Classification | Light characteristics of packages | | | | |
|---|---|---|---|---|---|
| | CIEx | CIEy | Lm | CRI | CCT |
| Comparative Example 1 | 0.3485 | 0.3521 | 41.6 | 84.7 | 4878 |
| Example 5-1 | 0.3708 | 0.4068 | 42.3 | 86.4 | 4447 |
| Example 5-2 | 0.3546 | 0.3755 | 40.1 | 87.5 | 4767 |
| Example 5-3 | 0.3653 | 0.3939 | 40.8 | 89.1 | 4531 |
| Example 5-4 | 0.3418 | 0.3681 | 38.4 | 94.4 | 5174 |
| Comparative Example 2 | 0.3837 | 0.4464 | 38.2 | 83.4 | 4330 |

TABLE 18

| Classification | Light characteristics of packages | | | | |
|---|---|---|---|---|---|
| | CIEx | CIEy | Lm | CRI | CCT |
| Comparative Example 3 | 0.3704 | 0.3039 | 22.4 | 64.9 | 3620 |
| Example 5-5 | 0.3728 | 0.3106 | 23.63 | 73.6 | 3610 |
| Example 5-6 | 0.375 | 0.3005 | 24.5 | 79 | 3400 |

TABLE 19

| Classification | Light characteristics of packages | | | | |
|---|---|---|---|---|---|
| | CIEx | CIEy | Lm | CRI | CCT |
| Comparative Example 4 | 0.3425 | 0.3489 | 29.2 | 90.8 | 5127 |
| Example 5-7 | 0.3539 | 0.3652 | 30.5 | 93.1 | 4762 |
| Example 5-8 | 0.3625 | 0.3725 | 32.8 | 95.2 | 4506 |
| Example 5-9 | 0.3525 | 0.3691 | 29.9 | 98.5 | 4813 |
| Example 5-10 | 0.3418 | 0.3684 | 38.4 | 94.4 | 5174 |

As confirmed in Tables 17 to 19, the amount of a bluish green (BG) luminescence phosphor may be controlled per green phosphor and red phosphor luminescence wavelength areas.

For example, in the third embodiment, when the bluish green phosphor having the composition formula of Formula 3 is included in an amount of 10 to 15 wt %, a color rendering index (CRT) of 95 Ra or more and 99 Ra or less is realized and a light emitting device package emitting white light may be provided.

In addition, the light emitting device packages of the embodiments exhibit dramatically increased color rendering indexes (CRT), when compared to the light emitting device packages manufactured according to conventional green phosphor and red phosphor combinations (Comparative Examples 1 to 4).

The light emitting device package of the embodiment may realize a color rendering index (CRT) of 60 Ra or more and 99 Ra or less at a color temperature (CCT) of 2,000 to 10,000 K by controlling a content of a bluish green phosphor as described in the first embodiment to third embodiment and mixing a large amount of a bluish green, instead of red which lowers luminous efficiency.

<Examples 5-11 to 5-14> Light Emitting Device Packages Including Bluish Green (BG) Phosphor Having Composition Formula of Formula 2

Light emitting device packages were manufactured in the same manner as in Example 5-1, except that a bluish green (BG) luminescence phosphor represented by a composition formula of Formula 2 was used and phosphors were mixed as disclosed in Table 20. For example, in a composition formula of Formula 2, B may be Si, G may be F, and RE may be Eu.

<Comparative Example 5> Manufacture of Light Emitting Device Package as Third Embodiment Comparative Example 5 was performed in the same manner as in Example 5-1, except that phosphors were mixed as described in Table 20.

TABLE 20

| | Ratios of phosphors | | | |
|---|---|---|---|---|
| Classification | BG | LuAG-3 (535 nm to 545 nm) | (Sr,Ca)AlSiN3-3 (650 nm~665 nm) | Total(%) |
| Comparative Example 5 | 0 | 90 | 10 | 100 |
| Example 5-11 | 5 | 85 | 10 | 100 |
| Example 5-12 | 10 | 80 | 10 | 100 |
| Example 5-13 | 15 | 75 | 10 | 100 |
| Example 5-14 | 20 | 70 | 10 | 100 |

It can be confirmed that, when a white LED device uses a bluish green (BG) phosphor according to the composition formula of Formula 2 and is manufactured according to the combination of the green phosphor and the red phosphor of the third embodiment, the white LED device realizes a color rendering index (CRI) of 60 Ra or more and 99 Ra or less at a color temperature (CCT) of 2,000 K to 10,000 K.

<Experimental Example 3> Measurement of Color Rendering Index (CRI)

For example, a white LED device may use a $Ba_{2.84}Mg_{0.11}Si_{5.95}O_{3.4}N_{8.33}F_{0.22}:Eu_{0.15}$ phosphor of the phosphors prepared above, and color rendering indexes (CRI) of the white LED device and a commercially available LED device were measured.

A color rendering index (CRI) is a quantitative measure of the ability of a light source to reveal the colors of various objects faithfully in comparison with an ideal light source. The color rendering index is preferably as close as possible to 100. Results are summarized in Table 21.

TABLE 21

| Comment | Im | Cx | Cy | CCT/K | CRI |
|---|---|---|---|---|---|
| Commercially available LED | 8.9 | 0.346 | 0.360 | 4989.0 | 90.6 |
| White LED applied to phosphor of the present invention | 9.6 | 0.346 | 0.360 | 5005.5 | 90.3 |

As confirmed in Table 21, the commercially available white LED device realized by combining a blue LED light emitting device of a 440 to 465 nm area with a green phosphor of 520 to 560 nm and a red phosphor may realize a color rendering index (CRI) of greater than 90 at a color temperature (CCT) of 2700 to 6500 K.

In addition, when the $Ba_{2.84}Mg_{0.11}Si_{5.95}O_{3.4}N_{8.33}F_{0.22}$: $Eu_{0.15}$ bluish green phosphor of the present invention is used in a white LED device, a color rendering index (CRI) of greater than 90 may be realized at a color temperature (CCT) of 2700 to 6500 K.

In a light emitting device package including the commercially available LED light emitting device, efficiency of luminous intensity reduces by approximately 2 to 3% when a color rendering index (CRI) increases by 1 at a color temperature (CCT) of 2700 K to 6500K. However, when the $Ba_{2.84}Mg_{0.11}Si_{5.95}O_{3.4}N_{8.33}F_{0.22}:Eu_{0.15}$ bluish green phosphor was used as the embodiment of the present invention, luminous intensity efficiency reduces by 1 to 2% according to increase of a color rendering index (CRI) and thereby a reduction width of luminous intensity is dramatically decreased, and, accordingly, luminous intensity of the light emitting device package may be entirely improved.

For example, when white color is realized using the green phosphor ($Lu_3Al_5O_{12}:Ce$) and the red phosphor ($CaAlSiN_3:Eu$) according to a conventional method, a color rendering index (CRI) increases from 80 to 90 and luminous intensity reduces by 20 to 30% at a color temperature (CCT) of 2700 K to 6500K. Here, if luminous intensity is 100% when color rendering index (CRI) is 80, luminous intensity is approximately 70 to 80% when color rendering index (CRI) is 90.

On the other hand, when a light emitting device package emitting white light is manufactured by adding a green phosphor and a red phosphor to the embodiment of the bluish green phosphor, if luminous intensity is 100% at a color rendering index (CRI) of 80, luminous intensity at a color rendering index (CRI) of 90 is observed as being approximately 80 to 90%, and, accordingly, luminous intensity is improved by 10%.

As a result, it can be confirmed that luminous intensity of the white LED device further including the bluish green luminescence phosphor according to the present invention increases by approximately 8% as 8.9 to 9.6 lm, while maintaining a CRI value identical to the commercially available white LED device.

Accordingly, a light emitting device package emitting white light using the bluish green phosphor of the embodiment according to the present invention suppresses excessive use of a red phosphor ingredient and reduces efficiency reduction in some of other phosphors by a red phosphor, and thereby luminous intensity is improved and color rendering increases, and, accordingly, luminescence efficiency may be increased.

INDUSTRIAL APPLICABILITY

A bluish green phosphor according to the embodiment of the present invention and a light emitting device package using the same are applicable to display apparatus, lighting apparatus and the like and may exhibit improved luminance and a color rendering index.

The invention claimed is:

1. A bluish green phosphor represented by Formula 2 below:

$$Ba_xMg_yB_zO_cN_dG_e:Pm_h \quad \text{[Formula 2]}$$

wherein B is at least one selected from the group consisting of Si, Ge and Sn elements, O means oxygen, N means nitrogen, G is any one of Cl, F and Br elements, $0.5 < x \leq 15$, $0 < y \leq 10$, $0.5 < x+y \leq 15$, $0 \leq e \leq 10$, and $0 < h \leq 10$, wherein $0.5 \leq x \leq 2.5$, $0 < y \leq 0.5$, and $0.5 < x+y \leq 2.5$, wherein a wavelength area of 300 nm to 500 nm is used as an excitation source and luminescence wavelength is 460 nm to 540 nm, wherein a ratio of y/x satisfies $0 < y/x \leq 0.4$, and wherein the bluish green phosphor has a single phase crystal structure by transferring $Mg^{2+}$ ions to lattices of $Ba^{2+}$ cathode ion sites.

2. The bluish green phosphor according to claim 1, wherein, Formula 2, B is Si.

3. A light emitting device package comprising:
at least one light emitting device emits light of an ultraviolet wavelength area or a blue wavelength area; and
a molding part disposed on the at least one light emitting device and comprising a phosphor composition,
wherein the phosphor composition comprises the bluish green phosphor according to claim 1;
any one of a green phosphor or a yellow phosphor; and
a red phosphor.

4. The light emitting device package according to claim 3, wherein any one of the green phosphor or the yellow phosphor has a central luminescence wavelength of 510 nm to 570 nm, and
the red phosphor has a central luminescence wavelength of 610 nm to 670 nm.

5. The light emitting device package according to claim 3, wherein any one of the green phosphor and yellow phosphor is $(Lu,Gd)_3(Al,Ga)_5O_{12}:Ce^{3+}$ or $(Y,Gd)_3(Al,Ga)_5O_{12}:Ce^{3+}$.

6. The light emitting device package according to claim 3, wherein the red phosphor is $(Sr,Ca)AlSiN_3:Eu^{2+}$ or $(Sr,Ba,Ca)_2Si_5N_8:Eu^{2+}$.

7. The light emitting device package according to claim 3, wherein the phosphor composition is comprised in the molding part in a dispersive type; a conformal type; or a remote type.

8. The light emitting device package according to claim 3, wherein the molding part comprises a resin part, and
the bluish green phosphor is included in 0.1 or more and 99 or less parts by weight based on 100 parts by weight of the resin part.

9. The light emitting device package according to claim 3, wherein a color rendering index (CRI) is 60 Ra or more and 99 Ra or le at a color temperature (CCT) of 2,000K to 10,000 K.

10. The light emitting device package according to claim 3, wherein any one of the green phosphor or the yellow phosphor has a central luminescence wavelength of 525 nm to 535 nm,
the red phosphor has a central luminescence wavelength of 625 nm to 635 nm, and
the bluish green phosphor has a weight ratio as follows:

$$0 \text{ wt \%} < M < 50 \text{ wt \%}$$

wherein M={mb/(mb+mg+mr)}*100, mb is the weight of the bluish green phosphor, mg is the weight of any one of the green and yellow phosphor, and mr is the weight of the red phosphor.

11. The light emitting device package according to claim 3, wherein any one of the green phosphor or yellow phosphor has a central luminescence wavelength of 520 nm to 530 nm,
the red phosphor has a central luminescence wavelength of 650 nm to 665 nm, and
the bluish green phosphor has a weight ratio as follows:

$$0 \text{ wt \%} < M < 20 \text{ wt \%}$$

wherein M={mb/(mb+mg+mr)}*100, mb is the weight of the bluish green phosphor, mg is the weight of any one of the green and yellow phosphor, and mr is the weight of the red phosphor.

12. The light emitting device package according to claim 3, wherein any one of the green and yellow phosphor has central luminescence wavelength of 535 nm to 545 nm,
the red phosphor has a central luminescence wavelength of 650 nm to 665 nm, and the bluish green phosphor has a weight ratio as follows:

$$0 \text{ wt \%} < M < 40 \text{ wt \%}$$

wherein M={mb/(mb+mg+mr)}*100, mb is the weight of the bluish green phosphor, mg is the weight of any one of the green and yellow phosphor, and mr is the weight of the red phosphor.

13. The light emitting device package according to claim 12, wherein, when a weight ratio of the bluish green phosphor is 5 wt % to 35 wt %, a color rendering index (CRI) is between 90 Ra and 99 Ra.

14. The light emitting device package according to claim 3, wherein the light emitting device package has luminescence wavelength peaks such as a first peak at 440 nm to 460 nm, a second peak at 490 nm to 510 nm, a third peak at 530 nm to 540 nm, and a fourth peak at 650 nm to 655 nm.

15. The bluish green phosphor according to claim 1, wherein the luminescence wavelength comprises only one emission peak, and wherein the central wavelength of the luminescence wavelength of the only one emission peak is 490 nm to 500 nm.

* * * * *